(12) United States Patent
Toda et al.

(10) Patent No.: US 8,816,377 B2
(45) Date of Patent: Aug. 26, 2014

(54) PHOSPHOR AND LIGHT EMITTING DEVICE

(75) Inventors: Kenji Toda, Niigata (JP); Tadashi Ishigaki, Fukushima (JP)

(73) Assignee: Panasonic Corporation, Osaka (JP)

( * ) Notice: Subject to any disclaimer, the term of this patent is extended or adjusted under 35 U.S.C. 154(b) by 38 days.

(21) Appl. No.: 13/818,766

(22) PCT Filed: Nov. 28, 2011

(86) PCT No.: PCT/JP2011/077378
§ 371 (c)(1),
(2), (4) Date: Feb. 25, 2013

(87) PCT Pub. No.: WO2012/073887
PCT Pub. Date: Jun. 7, 2012

(65) Prior Publication Data
US 2013/0146930 A1   Jun. 13, 2013

(30) Foreign Application Priority Data

Nov. 30, 2010   (JP) .................................. 2010-267108
Feb. 10, 2011   (JP) .................................. 2011-027495

(51) Int. Cl.
*H01L 33/00* (2010.01)
*C09K 11/77* (2006.01)
*H05B 33/14* (2006.01)
*H01L 33/50* (2010.01)

(52) U.S. Cl.
CPC ......... *C09K 11/7701* (2013.01); *C09K 11/7793* (2013.01); *H01L 33/507* (2013.01); *H05B 33/14* (2013.01); *H01L 33/502* (2013.01); *C09K 11/7792* (2013.01)
USPC ....................................... 257/98; 252/301.4 R

(58) Field of Classification Search
CPC .......................... H01L 33/502; C09K 11/7701
See application file for complete search history.

(56) References Cited

U.S. PATENT DOCUMENTS 6,203,726 B1 *   3/2001   Danielson et al. ..... 252/301.4 R
6,466,135 B1 *   10/2002   Srivastava et al. ......... 340/815.4

(Continued)

FOREIGN PATENT DOCUMENTS

| JP | 3700502 B | 7/2005 |
| JP | 4104013 B | 4/2008 |
| JP | 4148245 B | 7/2008 |

OTHER PUBLICATIONS

International Search Report for corresponding International Application No. PCT/JP2011/077378 mailed Feb. 21, 2012.

(Continued)

*Primary Examiner* — Lex Malsawma
(74) *Attorney, Agent, or Firm* — Renner, Otto, Boisselle & Sklar, LLP

(57) ABSTRACT

The present invention provides a phosphor emitting green fluorescence when being effectively excited by excitation light in a wavelength range from blue light to near-ultraviolet light, having an emission intensity that does not vary significantly with variation in the wavelength of the excitation light, and being manufactured easily. The phosphor includes a chemical structure represented by the following general formula (A):

$$A(M_{1-a-x}Eu_aMn_x)L(Si_{1-b}Ge_b)_2O_7, \quad (A),$$

where A is one or more elements selected from Li, Na, and K, M is one or more elements selected from Mg, Ca, Sr, Ba, and Zn, L is one or more elements selected from Ga, Al, Sc, Y, La, Gd, and Lu, a is a numerical value satisfying $0.001 \le a \le 0.3$, b is a numerical value satisfying $0 \le b \le 0.5$, and x is a numerical value satisfying $0 \le x \le 0.2$.

16 Claims, 10 Drawing Sheets

(56) References Cited

U.S. PATENT DOCUMENTS

| | | | |
|---|---|---|---|
| 6,809,781 B2* | 10/2004 | Setlur et al. | 349/70 |
| 6,953,536 B2* | 10/2005 | Yen et al. | 252/301.4 F |
| 7,828,993 B2* | 11/2010 | Roth et al. | 252/301.4 F |
| 7,952,270 B2* | 5/2011 | Bechtel et al. | 313/504 |
| 7,982,229 B2* | 7/2011 | Bechtel et al. | 257/98 |
| 2004/0056990 A1* | 3/2004 | Setlur et al. | 349/69 |
| 2006/0214175 A1* | 9/2006 | Tian | 257/98 |
| 2007/0014318 A1* | 1/2007 | Hajjar et al. | 372/9 |
| 2008/0217636 A1* | 9/2008 | Bechtel et al. | 257/98 |
| 2010/0187976 A1* | 7/2010 | Winkler | 313/504 |

OTHER PUBLICATIONS

PCT/ISA/237 for corresponding International Application No. PCT/JP2011/0773 dated Feb. 21, 2012.

* cited by examiner

PHOSPHOR AND LIGHT EMITTING DEVICE

TECHNICAL FIELD

The present invention relates to a phosphor, and a light emitting device including the phosphor.

BACKGROUND ART

In recent years, in association with improvement of luminous efficiency of light emitting diodes (LEDs), light emitting devices to which LEDs are applied have been widespread and expanded in use. In particular, a light emitting device including an LED and a phosphor for converting the wavelength of light emitted from the LED allows higher efficiency, reduced size and thickness, and electric power saving. In addition, the light emitting device can emit light of an arbitrary color according to the purpose of use, such as white or light bulb color. Therefore, such a light emitting device is expected to be used for: indoor and outdoor lighting apparatus; liquid crystal displays; backlight sources of mobile phones, personal digital assistants and the like; display devices used for indoor and outdoor advertisements and the like; in-vehicle light sources; and the like, and is being developed.

Various configurations of light emitting devices emitting white light have been proposed. Among the light emitting devices, a light emitting device having a blue LED and a yellow phosphor (refer to Patent Literature 1, for example) is most popular. This light emitting device utilizes that blue and yellow are complementary colors. A part of blue light emitted from the blue LED is converted to yellow light by the yellow phosphor, and thereby pseudo white light including blue light and yellow light is emitted from the light emitting device.

However, although the light emitting device emitting such pseudo white light has high luminous efficiency, since the pseudo white light does not include, or includes very little, green light and red light, the light emitting device has poor color rendering properties.

A light emitting device including a blue LED, a green phosphor, and a red phosphor (refer to Patent Literature 2, for example), and a light emitting device including a near-ultraviolet LED, a blue phosphor, a green phosphor, and a red phosphor (refer to Patent Literature 3, for example) have also been proposed as light emitting devices emitting white light. White light that is relatively close to natural light and includes blue light, green light, and red light is emitted from each of these light emitting devices.

Patent Literature 2 discloses, as a green phosphor, a photoluminescence phosphor having a garnet structure and containing cerium. The photoluminescence phosphor is able to absorb blue light, and emit an emission spectrum having a peak at a wavelength in a range from 530 nm to 570 nm, and tailing out to at least 700 nm.

Patent Literature 3 discloses, as a green phosphor, a phosphor which is represented by a general formula of $Eu_s(Si, Al)_{6-s}(O, N)_8$, and has a main phase having a β-Sialon crystal structure. In the general formula, s is a numerical value of not less than 0.011 but not more than 0.019.

However, in the green phosphor disclosed in Patent Literature 2, since an emission center ion is $Ce^{3+}$, the wavelength of excitation light is limited to a range of 440 nm to 460 nm in order to make the emission intensity of the stable green phosphor. Therefore, this green phosphor is effective only when used in combination with the blue LED. When it is used in combination with, for example, a near-ultraviolet LED, there is a problem that the emission intensity of the green phosphor is not sufficiently increased. Even when the green phosphor is used in combination with the blue LED, variations in emission wavelengths of blue LEDs may occur among different production lots, or the emission wavelength of each blue LED may vary due to rise in the temperature thereof. Thereby, the emission intensity of the green phosphor is likely to vary significantly. Consequently, the luminous flux and chromaticity of the white light emitted from the light emitting device are likely to vary.

The green phosphor disclosed in Patent Literature 3 is manufactured through a process step in which raw materials are burned at a high temperature of 1820° C. to 2200° C. in nitrogen atmosphere. Therefore, a manufacturing facility for high-temperature heating is needed, and the manufacturing process is complicated very much, resulting in high manufacturing cost.

CITATION LIST

Patent Literature

Patent Literature 1: Japanese Patent No. 3700502
Patent Literature 2: Japanese Patent No. 4148245
Patent Literature 3: Japanese Patent No. 4104013

SUMMARY OF THE INVENTION

Problems to be Solved by the Invention

The present invention is made in view of the above situation, and has an object to provide: a phosphor which emits green fluorescence when being effectively excited by excitation light in a wavelength range from blue light to near-ultraviolet light, has an emission intensity that does not vary significantly with variation in the wavelength of the excitation light, and can be manufactured easily; and a light emitting device including the phosphor.

Solution to the Problems

A phosphor according to the present invention has a chemical structure represented by the following general formula (A).

$$A(M_{1-a-x}Eu_aMn_x)L(Si_{1-b}Ge_b)_2O_7, \quad (A)$$

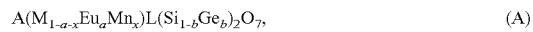

wherein A is one or more elements selected from the group consisting of Li, Na, and K, M is one or more elements selected from the group consisting of Mg, Ca, Sr, Ba, and Zn, L is one or more elements selected from the group consisting of Ga, Al, Sc, Y, La, Gd, and Lu, a is a numerical value satisfying 0.001≤a≤0.3, b is a numerical value satisfying 0≤b≤0.5, and x is a numerical value satisfying 0≤x≤0.2.

In the present invention, x in the general formula (A) preferably satisfies x=0. In this case, the phosphor according to the present invention has a chemical structure represented by the following general formula (1).

$$A(M_{1-a}Eu_a)L(Si_{1-b}Ge_b)_2O_7, \quad (1)$$

wherein A is one or more elements selected from Li, Na, and K, M is one or more elements selected from Mg, Ca, Sr, Ba, Zn and Mn, L is one or more elements selected from Ga, Al, Sc, Y, La, Gd, and Lu, a is a numerical value that satisfies 0.001≤a≤0.3, and b is a numerical value that satisfies 0≤b≤0.5.

In the present invention, it is also preferable that x in the general formula (A) satisfies 0≤x≤0.2.

In the present invention, A in the general formula (1) preferably comprises Li.

In the present invention, it is also preferably that A in the general formula (A) comprises Na.

In the present invention, it is also preferable that A in the general formula (A) consists of at least two elements.

In the present invention, it is also preferable that M in the general formula (A) comprises Ba.

In the present invention, it is also preferable that M in the general formula (A) consists of at least two elements.

In the present invention, it is also preferable that L in the general formula (A) comprises Sc. It is also preferable that L in the general formula (A) further comprises Y.

The phosphor according to the present invention preferably has a composition represented by the following general formula (2).

$$A^1_{1-y}A^2_y Ba_{1-a}Eu_a ScSi_2O_7, \quad (2)$$

wherein $A^1$ and $A^2$ are elements selected from the group consisting of Li, Na, and K, $A^1$ and $A^2$ are different from each other, y is a numerical value satisfying $0 < y < 1$, and a is a numerical value satisfying $0.001 \le a \le 0.3$.

It is also preferable that the phosphor according to the present invention has a composition represented by the following general formula (3).

$$NaBa_{1-a}Eu_a ScSi_2O_7, \quad (3)$$

wherein a is a numerical value satisfying $0.001 \le a \le 0.3$.

It is also preferable that the phosphor according to the present invention has a composition represented by the following general formula (4).

$$NaBa_{1-a}Eu_a Sc_{1-z}Y_z Si_2 O_7, \quad (4)$$

wherein z is a numerical value satisfying $0 < z < 1$, and a is a numerical value satisfying $0.001 \le a \le 0.3$.

It is also preferable that the phosphor according to the present invention has a composition represented by the following general formula (5).

$$NaM^1_p M^2_q Eu_a ScSo_2O_7, \quad (5)$$

wherein $M^1$ and $M^2$ are elements selected from the group consisting of Mg, Ca, Sr, Ba, and Zn, $M^1$ and $M^2$ are different from each other, a is a numerical value satisfying $0.001 \le a \le 0.3$, p is a numerical value satisfying $0 < p < 1$, q is a numerical value satisfying $0 < q < 1$, and p, q, and a satisfy $p+q+a=1$.

It is also preferable that the phosphor according to the present invention has a composition represented by the following general formula (6).

$$A(M_{1-a-x}Eu_a Mn_x)L(Si_{1-b}Ge_b)_2 O_7, \quad (6)$$

wherein A is one or more elements selected from the group consisting of Li, Na, and K, M is one or more elements selected from the group consisting of Mg, Ca, Sr, Ba, and Zn, L is one or more elements selected from the group consisting of Ga, Al, Sc, Y, La, Gd, and Lu, a is a numerical value satisfying $0.001 \le a \le 0.3$, b is a numerical value satisfying $0 \le b \le 0.5$, and x is a numerical value satisfying $0.01 \le x \le 0.2$.

A light emitting device according to the present invention comprises: a light emitting element which emits light having a main emission peak in a range of 350 nm to 470 nm; and a wavelength conversion member which absorbs the light emitted from the light emitting element and emits light. The wavelength conversion member comprises the above-described phosphor.

Advantageous Effects of the Invention

The phosphor according to the present invention emits green fluorescence when being effectively excited by excitation light in a wavelength range from blue light to near-ultraviolet light, has an emission intensity that does not vary significantly with variation in the wavelength of the excitation light, and can be easily manufactured.

The light emitting device according to the present invention, which includes the above-described phosphor, provides high luminous efficiency and high wavelength conversion efficiency.

DESCRIPTION OF EMBODIMENTS

[Phosphor]

Figure 1:
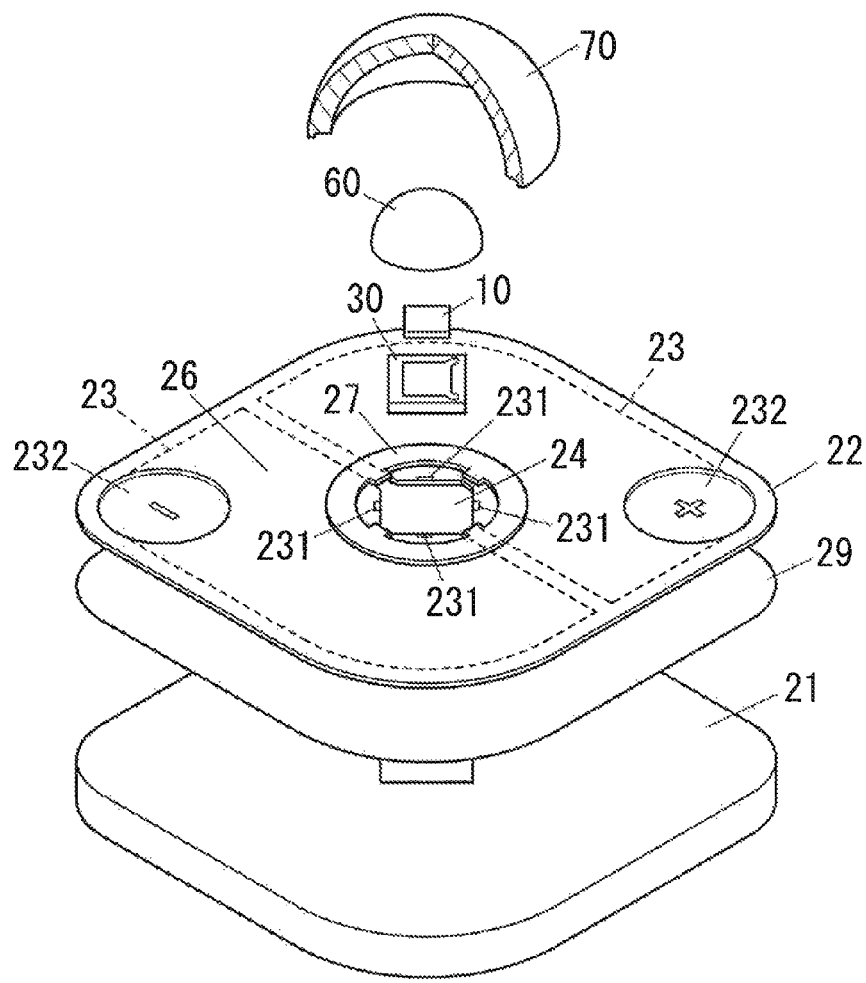
FIG. 1 is a partially cut-away exploded perspective view of a light emitting device according to an embodiment of the present invention.

A phosphor according to an embodiment of the present invention has a chemical structure represented by the following general formula (A).

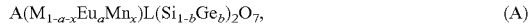

$$A(M_{1-a-x}Eu_aMn_x)L(Si_{1-b}Ge_b)_2O_7, \quad (A)$$

wherein A is one or more elements selected from Li, Na, and K, M is one or more elements selected from Mg, Ca, Sr, Ba, and Zn, L is one or more elements selected from Ga, Al, Sc, Y, La, Gd, and Lu, a is a numerical value that satisfies $0.001 \leq a \leq 0.3$, b is a numerical value that satisfies $0 \leq b \leq 0.5$, and x is a numerical value that satisfies $0 \leq x \leq 0.2$.

All of compositions represented by general formulae (1) to (6), respectively, as described later are subordinate concepts of the composition represented by general formula (A), and therefore, all of phosphors according to the compositions represented by general formulae (1) to (6), respectively, are included in the phosphor having the chemical structure represented by general formula (A).

In general formula (A), the composition ratio (molar ratio) of $A:(M_{1-a-x}Eu_aMn_x):L:(Si_{1-b}Ge_b):O$ is 1:1:1:2:7. However, of course there are cases where the composition ratio of the phosphor is not exactly equal to this ratio, because of partial defects, existing of foreign matters, or other reasons in the crystal structure. Even when the composition ratio of the phosphor is not completely equal to 1:1:1:2:7, if the composition ratio can be substantially regarded as 1:1:1:2:7 based on common technical knowledge, this phosphor is included in the scope of the present invention.

When x is equal to 0 in general formula (A), the phosphor according to the present embodiment has a chemical structure represented by the following general formula (1).

$$A(M_{1-a}Eu_a)L(Si_{1-b}Ge_b)_2O_7, \quad (1)$$

wherein A is one or more elements selected from Li, Na, and K, M is one or more elements selected from Mg, Ca, Sr, Ba, and Zn, L is one or more elements selected from Ga, Al, Sc, Y, La, Gd, and Lu, a is a numerical value that satisfies $0.001 \leq a \leq 0.3$, and b is a numerical value that satisfies $0 \leq b \leq 0.5$.

This phosphor is the silicate-based phosphor activated by a divalent europium ion. In the phosphor crystal having such a composition, an emission center ion is a divalent europium ion $Eu^{2+}$. The $Eu^{2+}$ is dissolved in the crystal by substituting the metal element M for a part of sites occupied by divalent ions of the metal element M in the crystal. Having such a crystal structure, the phosphor is excited by effectively absorbing excitation light in a wavelength range from near-ultraviolet light to blue light, particularly, in a wavelength range of 350 nm to 470 nm, and effectively emits fluorescence having a wavelength longer than the wavelength of the excitation light.

In general formula (A) and general formula (1), A is one or more alkali metal elements selected from Li, Na, and K, as described above. A may consist of only one element or two or more elements selected from Li, Na, and K. When A consists of two or more elements, the ratio of the two or more elements in A may be appropriately determined.

Particularly, it is preferable that A in general formula (A) and general formula (1) certainly contains Li. That is, preferably, A consists of only Li, or A consists of Li and at least one of Na and K. In this case, the $Eu^{2+}$ ion is more likely to selectively substitute for the divalent ion of the metal element M in the site occupied by the divalent ion of the metal element M in the crystal, and consequently, the luminous efficiency of the phosphor is particularly improved. Particularly, the ratio of Li in A is preferably 1 to 100 mol %.

It is also preferable that A in general formula (A) and general formula (1) certainly contains Na. That is, preferably, A consists of only Na, or A consists of Na and at least one of Li and K. In this case, the crystallinity of the phosphor is further improved.

It is also preferable that A in general formula (A) and general formula (1) consists of at least two elements. That is, A preferably consists of at least two elements selected from Na, Li, and K. In this case, by adjusting the composition ratio of the at least two elements, the emission peak wavelength can be controlled within a range of several nanometers.

In general formula (A) and general formula (1), M is one or more metal elements selected from Mg, Ca, Sr, Ba, and Zn, as described above. M may consist of one element or two or more elements selected from Mg, Ca, Sr, Ba, and Zn. When M consists of two or more elements, the ratio of the two or more elements in M may be appropriately determined. In the crystal, the metal element M serves as a divalent ion as described above.

Particularly, it is preferable that M in general formula (A) and general formula (1) certainly contains Ba. That is, preferably, M consists of only Ba, or M consists of Ba and at least one of Mg, Ca, Sr, and Zn. In this case, the crystallinity of the phosphor is further improved.

It is also preferable that M in general formula (A) and general formula (1) consists of at least two elements. That is, M preferably consists of at least two elements selected from Mg, Ca, Sr, Ba, and Zn. In this case, by adjusting the composition ratio of the at least two elements, the emission peak wavelength can be controlled within a range of several nanometers.

In general formula (A) and general formula (1), a is a numerical value indicating a molar ratio of Eu to the metal element M, and satisfies $0.001 \leq a \leq 0.3$ as described above. When the value of a is 0.001 or more, the concentration of the divalent europium ion in the crystal is sufficiently high. When the value of a is 0.3 or less, concentration quenching is suppressed, and thereby the emission intensity of the phosphor becomes sufficiently high. In order to further reduce the concentration quenching, the value of a is preferably 0.2 or less. That is, when a is a numerical value satisfying $0.001 \leq a \leq 0.2$, the emission intensity of the phosphor becomes particularly high. Furthermore, a is preferably a numerical value satisfying $0.01 \leq a \leq 0.1$.

In general formula (A) and general formula (1), L is one or more metal elements selected from Ga, Al, Sc, Y, La, Gd, and Lu, as described above. L may consist of only one element or two or more elements selected from Ga, Al, Sc, Y, La, Gd, and Lu. When L consists of two or more elements, the ratio of the two or more elements in L may be appropriately set. In the crystal, the metal element L serves as a trivalent ion.

Particularly, it is preferable that L in general formula (A) and general formula (1) certainly contains Sc. That is, preferably, L consists of only Sc, or L consists of Sc and at least one of Ga, Al, Y, La, Gd, and Lu. In this case, the crystallinity of the phosphor is further improved.

Particularly, it is also preferable that L in general formula (A) and general formula (1) contains Sc, and further contains Y. That is, preferably, L consists of only Sc and Y, or L consists of Sc, Y, and at least one of Ga, Al, La, Gd, and Lu. In this case, by adjusting a ratio of the above compositions, the emission peak wavelength can be controlled within a range of several nanometers.

As shown in general formula (A) and general formula (1), a part of Si in the crystal may be substituted for Ge. In general formula (A) and general formula (1), b is a numerical value indicating a molar ratio (substitution ratio) of Ge to Si, and satisfies $0 \leq b \leq 0.5$, as described above. When the value of b is 0.5 or less, high luminous efficiency of the phosphor is maintained.

A description will be given of an example of a method for manufacturing the phosphor. First, a plurality of raw materials are blended to prepare a mixture. The blending ratio of the raw materials is adjusted so that the composition of metal elements in the mixture matches with the composition represented by general formula (A) or general formula (1).

For example, in the general formula (1), when A, M and L are Na, Ba and Sc, respectively, and b satisfies b=0, that is, in the case where a phosphor, having the composition of $NaBaScSi_2O_7:Eu^{2+}$, is manufactured, powders of $Na_2CO_3$, $BaCO_3$, $Eu_2O_3$, $Sc_2O_3$, and $SiO_2$ are used as raw materials, for example. The blending ratio of these raw materials is adjusted so that molar ratio of Na, Ba, Sc, Si, and Eu in the mixture matches with the composition of the phosphor.

Next, a container made of a material such as alumina or quartz is prepared, and the mixture is put into the container. Then, the mixture in the container is burned at a temperature of 1000 to 1300° C. in a non-oxidizing gas atmosphere. The non-oxidizing gas atmosphere preferably includes a weakly reducing gas such as a hydrogen/nitrogen mixture gas. Before the mixture is burned as described above, the mixture may be calcinated in the air. In this case, the crystallinity of the phosphor is particularly improved. When the mixture is calcinated, the calcination temperature is preferably not higher than the burning temperature (the above-mentioned burning in the non-oxidizing gas atmosphere which follows the calcinating).

As described above, the phosphor according to the present embodiment can be manufactured through the process step in which the raw materials are burned at a relatively low temperature of 1000 to 1300° C. in the non-oxidizing gas atmosphere. Therefore, a manufacturing facility for heating at high-temperature is not needed, and the manufacturing process is simplified. Consequently, the phosphor according to the present embodiment can be easily manufactured.

Next, a sintered body obtained by sintering the mixture is cracked and grinded, and then washed with water or acid. Thereby, unnecessary components are removed. Thus, the powder of the phosphor having the intended composition can be obtained.

The phosphor according to the present embodiment is applicable to a light emitting device having a light emitting element such as an LED. The light emitting element is not particularly limited, and is preferably a light emitting element which emits light having a main emission peak in a range of 350 nm to 470 nm. A nitride semiconductor LED is a preferred example of such a light emitting element. The nitride semiconductor in the nitride semiconductor LED is, for example, a compound semiconductor having a composition of $In_xGa_yAl_zN$ ($0 \leq x \leq 1$, $0 \leq y \leq 1$, $0 \leq z \leq 1$, $x+y+z=1$). Major examples of the nitride semiconductor include AN, GaN, AlGaN, and InGaN.

When the nitride semiconductor LED emits violet light or near-ultraviolet light, the emission wavelength of the nitride semiconductor LED is 410 nm or less. When the emission wavelength is in a range of 365 nm to 410 nm, the nitride semiconductor LED emits light with particularly high efficiency. When the nitride semiconductor LED emits blue light, if the emission wavelength of the nitride semiconductor LED is in a range of 420 nm to 480 nm, the nitride semiconductor LED emits light with particularly high efficiency. Accordingly, when the phosphor according to the present embodiment is applied to a light emitting device having such a nitride semiconductor LED, the luminous efficiency of the light emitting device is particularly improved.

A description will be given of specific aspects of the phosphor according to the present embodiment.

In a first aspect, the phosphor has a composition represented by the following formula (2).

$$A^1_{1-y}A^2_yBa_{1-a}Eu_aScSi_2O_7, \quad (2)$$

In the first aspect, $A^1$ and $A^2$ are elements selected from Li, Na, and K, and $A^1$ and $A^2$ are different from each other. Particularly, Na is cited as an example of $A^1$, and K or Li is cited as an example of $A^2$.

In formula (2), y is a value indicating a molar ratio of $A^2$ to the sum of $A^1$ and $A^2$. The value y may be a numerical value that satisfies $0<y<1$. When $A^1$ and $A^2$ are Na and K, respectively, y preferably satisfies $0.05 \leq y \leq 0.7$. When $A^1$ and $A^2$ are Na and Li, respectively, y preferably satisfies $0.3 \leq y \leq 0.7$.

In a second aspect, the phosphor has a composition represented by the following formula (3).

$$NaBa_{1-a}Eu_aScSi_2O_7, \quad (3)$$

In a third aspect, the phosphor has a composition represented by the following formula (4).

$$NaBa_{1-a}Eu_aSc_{1-z}Y_zSi_2O_7, \quad (4)$$

In formula (4), z is a value indicating a molar ratio of Y to the sum of Sc and Y. The value z may be a numerical value that satisfies $0<z<1$. Particularly, z preferably satisfies $0.05 \leq z \leq 0.5$, and also preferably satisfies $0.05<z<0.3$.

In a fourth aspect, the phosphor has a composition represented by the following formula (5).

$$NaM^1_pM^2_qEu_aScSi_2O_7, \quad (5)$$

In the fourth aspect, $M^1$ and $M^2$ are elements selected from Mg, Ca, Sr, Ba, and Zn, and $M^1$ and $M^2$ are different from each other. Particularly, Ba is cited as an example of $M^1$, and Sr or Ca is cited as an example of $M^2$.

In formula (5), p is a value indicating a molar ratio of $M^1$ to the sum of $M^1$, $M^2$, and Eu, and q is a value indicating a molar ratio of $M^2$ to the sum of $M^1$, $M^2$, and Eu. In formula (5), p satisfies $0<p<1$, q satisfies $0<q<1$, and p, q, and a satisfy $p+q+a=1$. When $M^1$ is Ba and $M^2$ is Sr, q preferably satisfies $0.1 \leq q \leq 0.3$. When $M^1$ is Ba and $M^2$ is Ca, q preferably satisfies $0<q<0.1$.

In a fifth aspect, the phosphor has a composition in which $0<x \leq 0.2$ is satisfied in general formula (A). In this case, the phosphor has a composition represented by the following general formula (6) in which x satisfies $0<x \leq 0.2$.

$$A(M_{1-a-x}Eu_aMn_x)L(Si_{1-b}Ge_b)_2O_7, \quad (6)$$

In the fifth aspect, A is one or more elements selected from Li, Na, and K, M is one or more elements selected from Mg, Ca, Sr, Ba, and Zn, and L is one or more elements selected from Ga, Al, Sc, Y, La, Gd, and Lu.

In formula (6), x is a value indicating a molar ratio of Mn to the sum of M, Eu, and Mn. Preferably, x satisfies $0.01 \leq x \leq 0.2$. More preferably, x is in a range of $0.01 \leq x \leq 0.1$. Particularly preferably, x is in a range of $0.01 \leq x \leq 0.07$.

In the first to fifth aspects, the phosphor is excited by effectively absorbing the excitation light in a wavelength range from near-ultraviolet light to blue light, particularly, in a wavelength range of 350 nm to 470 nm, and effectively emits fluorescence having a wavelength longer than the wavelength of the excitation light. Each emission spectra of the phosphors according to these aspects have a strong emission peak in a green region, and the color of light emitted from the phosphor is green.

Moreover, in the fifth aspect, the emission spectrum of the phosphor also has an emission peak in a red region. As a reason, it is thought that Mn is used as a co-activator. The intensity of the emission peak in the red region is smaller than the intensity of the emission peak in the green region. In the fifth aspect, since the main emission peak appears in the red region, the color of light emitted from the phosphor becomes green. Further, since a relatively small emission peak also appears in the red region, the color rendering property of the light emitting device having this phosphor is particularly improved.

[Light Emitting Device]

Figure 2:
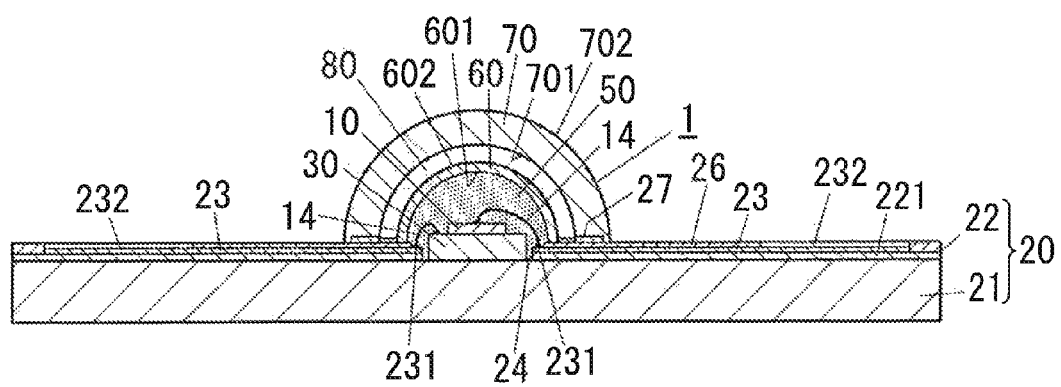
FIG. 2 is a cross-sectional view of the light emitting device.

A description will be given of a light emitting device according to the present embodiment. As shown in FIGS. 1 and 2, the light emitting device 1 includes: an LED chip 10 as a light emitting element; a mounting board 20; an optical member 60; a sealing part 50; and a wavelength conversion member (color conversion member) 70. As described later, the wavelength conversion member (color conversion member) 70 includes phosphor particles formed of the phosphor according to the present embodiment.

The LED chip 10 is mounted on the mounting board 20. The mounting board 20 is, for example, shaped a rectangular plate when viewed in plan. A pair of conductor patterns 23 for supplying power to the LED chip 10 are formed on a first surface of the mounting board 20 which is located in the thickness direction of the mounting board 20, and the LED chip 10 is mounted on the first surface. The LED chip 10 and the conductor patterns 23 are electrically connected to each other by bonding wires 14. The optical member 60 is a dome-shaped member, and is fixed to the first surface of the mounting board 20. The LED chip 10 is located between the optical member 60 and the mounting board 20. The optical member 60 has a function of controlling the orientation of light emitted from the LED chip 10. The sealing part 50 is made of an optically-transparent sealing material. The sealing part 50 is filled in a space enclosed by the optical member 60 and the mounting board 20. The LED chip 10 and a plurality of bonding wires 14 are sealed by the sealing part 50. Herein, two bonding wires 14 are exemplified in the present embodiment. The wavelength conversion member 70 is formed in a dome shape so as to enclose the optical member 60. When the LED chip 10 emits light, phosphor particles 71 in the wavelength conversion member 70 are excited by the light (excitation light) emitted from the LED chip 10, and emit fluorescence (converted light having a color different from the color of the light emitted from the LED chip 10) having a wavelength longer than the wavelength of the excitation light. A space 80 filled with a gas such as air is present between the optical member 60 and the wavelength conversion member 70. A ring-shaped dam part 27 surrounding the outer periphery of the optical member 60 is formed on the first surface of the mounting board 20. The dam part 27 is formed so as to protrude from the first surface. Therefore, when the optical member 60 is fixed to the mounting board 20, even if the sealing material is going to spill out of the space enclosed by the optical member 60 and the mounting board 20, the sealing material is blocked by the dam part 27.

The main emission peak of the LED chip 10 is preferably in a range of 350 nm to 470 nm. Examples of the LED chip 10 include a GaN-based blue LED chip which emits blue light, and a near-ultraviolet LED chip which emits near-ultraviolet light.

In the GaN-based blue LED chip, an n-type SiC substrate is used as a substrate for crystal growth. The n-type SiC substrate, GaN and a sapphire substrate have a lattice constant and a crystal structure. The lattice constant and crystal structure of the n-type SiC substrate is closer to those of GaN than those of the sapphire substrate, and the n-type SiC substrate has conductivity. A light emitting part having, for example, a double heterostructure is formed on the SiC substrate. The light emitting part is formed by an epitaxial growth method (e.g., MOVPE) using, for example, GaN-based compound semiconductor materials as raw materials. The LED chip 10 has a cathode electrode on a surface opposed to the first surface of the mounting board 20, and has an anode electrode on a surface opposite to the surface having the cathode electrode. Each of the cathode electrode and the anode electrode includes a laminate film configured by, for example, a Ni film and an Au film. The materials of the cathode electrode and the anode electrode are not particularly limited. The materials become to have excellent ohmic characteristics, and may be, for example, Al or the like.

The structure of the LED chip 10 is not limited to the structure described above. For example, the LED chip 10 may be formed through the steps of: forming a light emitting part and the like by epitaxial growth on a crystal growth substrate; fixing, to the light emitting part, a support substrate such as a Si substrate for supporting the light emitting part; and removing the crystal growth substrate.

The mounting board 20 includes a rectangular plate-shaped heat conducting plate 21, and a rectangular plate-shaped wiring substrate 22. The heat conducting plate 21 is made of a heat conductive material. The LED chip 10 is mounted on the heat conducting plate 21. The wiring substrate 22 is, for example, a rectangular plate-shaped flexible printed circuit board. The wiring substrate 22 is fixed to the heat conducting plate 21 via, for example, a polyolefin-based adhesive sheet 29. In a center portion of the wiring substrate 22, a rectangular window hole 24 is formed, in which a mount position of the LED chip 10 on the heat conducting plate 21 is exposed. Inside the window hole 24, the LED chip 10 is mounted on the heat conducting plate 21 via a sub-mount member 30 described later. Accordingly, heat generated in the LED chip 10 is conducted to the sub-mount member 30 and the heat conducting plate 21 without passing through the wiring substrate 22.

The wiring substrate 22 includes an insulating base 221 made of a polyimide film, and a pair of conductor patterns 23 for supplying power to the LED chip 10, which are formed on the insulating base 221. Further, the wiring substrate 22 includes a protective layer 26 which covers the conductor patterns 23, and covers a portion of the insulating base 221 where the conductor patterns 23 are not formed. The protective layer 26 is made of, for example, a white-based resist (resin) having light reflectivity. In this case, even when light is emitted from the LED chip 10 toward the wiring substrate 22, the light is reflected by the protective layer 26, and thereby light absorption in the wiring substrate 22 is suppressed.

Consequently, light extraction efficiency from the LED chip 10 to the outside is improved, and optical output of the light emitting device is improved. Additionally, each conductor pattern 23 is formed so as to have an outer peripheral shape that is a little smaller than the half of the outer peripheral shape of the insulating base 221. The insulating base 221 may be formed of a FR4 substrate, a FR5 substrate, a paper phenolic resin substrate, or the like.

Each conductor pattern 23 includes two terminal parts 231 which are rectangular in shape when viewed in plan. The terminal parts 231 are located near the window hole 24 of the wiring substrate 22, and the bonding wires 14 are connected to the terminal parts 231. Each conductor pattern 23 further includes an electrode part 232 for external connection which is circular in shape when viewed in plan. The electrode part 232 for external connection is located near the outer periphery of the wiring substrate 22. Each conductor pattern 23 consists of, for example, a laminate of a Cu film, a Ni film and an Au film.

The protective layer 26 is patterned so that each conductor pattern 23 is partially exposed from the protective layer 26. In the vicinity of the window hole 24 of the wiring substrate 22, the terminal part 231 of each conductor pattern 23 is exposed from the protective layer 26. Further, in the vicinity of the outer periphery of the wiring substrate 22, the electrode part 232 for external connection provided in each conductor pattern 23 is exposed from the protective layer 26.

The LED chip 10 is mounted on the heat conducting plate 21 via the sub-mount member 30 as described above. The sub-mount member 30 reduces stress applied to the LED chip 10 due to a difference in linear expansion coefficient between the LED chip 10 and the heat conducting plate 21. The sub-mount member 30 is shaped like a rectangular plate having a size larger than the chip size of the LED chip 10.

The sub-mount member 30 has, in addition to the function of reducing the stress as described above, a heat conducting function of conducting heat generated in the LED chip 10 to a region wider than the chip size of the LED chip 10 in the heat conducting plate 21. In the light emitting device 1 according to the present embodiment, since the LED chip 10 is mounted on the heat conducting plate 21 via the sub-mount member 30, the heat generated in the LED chip 10 is effectively dissipated through the sub-mount member 30 and the heat conducting plate 21, and the stress applied to the LED chip 10 due to the difference in linear expansion coefficient between the LED chip 10 and the heat conducting plate 21 is reduced.

The sub-mount member 30 is made of AlN having relatively high heat conductivity and insulation properties.

The cathode electrode of the LED chip 10 is mounted on the sub-mount member 30, and the cathode electrode is electrically connected to one of the two conductor patterns 23 via an electrode pattern (not shown) connected to the cathode electrode, and the bonding wire 14 formed of a thin metal wire (e.g., thin gold wire or thin Al wire). The LED chip 10 is electrically connected, via the bonding wire 14, to the conductor pattern 23 which is not connected to the cathode electrode.

To join the LED chip 10 and the sub-mount member 30 together, a solder such as SnPb, AuSn, or SnAgCu, or a silver paste is used, for example. Particularly, a lead-free solder such as AuSn or SnAgCu is preferably used. When the sub-mount member 30 is made of Cu and AuSn is used to join the LED chip 10 to the sub-mount member 30, the joint surfaces of the sub-mount member 30 and the LED chip 10 are preferably subjected to a pretreatment of forming a metal layer made of Au or Ag. To join the sub-mount member 30 and the heat conducting plate 21 together, a lead-free solder such as AuSn or SnAgCu is preferably used, for example. When AuSn is used to join the sub-mount member 30 to the heat conducting plate 21, the surface of the heat conducting plate 21 to be joined to the sub-mount member 30 is preferably subjected to a pretreatment of forming a metal layer made of Au or Ag.

The material of the sub-mount member 30 is not limited to AN, and any material may be used as long as the material has relatively high heat conductivity, and linear expansion coefficient nearly equal to that of 6H—SiC which is a material of the crystal growth substrate. For example, SiC, Si, Cu, or CuW composite may be used as a material of the sub-mount member 30. Since the sub-mount member 30 has the heat conducting function as described above, the area of the surface of the heat conducting plate 21 opposed to the LED chip 10 is desirably sufficiently larger than the area of the surface of the LED chip 10 opposed to the heat conducting plate 21.

In the light emitting device 1 according to the present embodiment, a thickness of the sub-mount member 30 is designed such that a thickness from an LED chip 10 side surface of the heat conducting plate 21 to an LED chip 10 side surface of the sub-mount member 30 a is greater than a thickness from the LED chip 10 side surface of the heat conducting plate 21 to an LED chip 10 side surface of the protective layer 26. Therefore, the light emitted from the LED chip 10 is suppressed from passing through the inside of the window hole 24 of the wiring substrate 22 to be absorbed in the wiring substrate 22. Thereby, the light extraction efficiency from the LED chip 10 to the outside is further improved, and the optical output of the light emitting device is further improved.

Additionally, on the LED chip 10 side surface of the sub-mount member 30 in its thickness direction, a reflective film for reflecting the light emitted from the LED chip 10 may be formed around the position where the LED chip 10 is disposed. In this case, the light emitted from the LED chip 10 is prevented from being absorbed in the sub-mount member 30. Thereby, the light extraction efficiency from the LED chip 10 to the outside is further improved, and the optical output of the light emitting device is further improved. The reflective film includes a laminate layer configured by, for example, a Ni film and an Ag film.

As a sealing material for forming the sealing part 50, silicone resin may be used. The sealing material is not limited to silicone resin, and acrylic resin or glass may be used.

The optical member 60 is made of a light-transmissive material (e.g., silicone resin, glass, or the like). Particularly when the optical member 60 is made of silicone resin, a difference in refractive index and a difference in linear expansion coefficient, between the optical member 60 and the sealing part 50, can be reduced.

A light emitting surface 602 (surface opposite to the LED chip 10 side) of the optical member 60 is formed in a convex curved shape such that the light entering the optical member 60 from a light incident surface 601 (LED chip 10 side surface) is prevented from being totally reflected at the boundary between the light emitting surface 602 and the space 80. The optical member 60 is arranged such that the optical axis thereof matches the optical axis of the LED chip 10. Accordingly, the light, which has been emitted from the LED chip 10 to enter the light incident surface 601 of the optical member 60, is more likely to reach the wavelength conversion member 70 without being totally reflected at the boundary between the light emitting surface 602 and the space layer 80, and thereby the total flux of the light emitted from the light emitting device increases. Additionally, the optical member 60 is formed so as to have a uniform thickness along the normal direction thereof regardless of the position.

The wavelength conversion member 70 is formed in such a shape that a light incident surface 701 (LED chip 10 side surface) of the conversion member 70 is along the light emitting surface 602 of the optical member 60. Accordingly, the distance between the light emitting surface 602 of the optical member 60 and the wavelength conversion member 70 in the normal direction is approximately constant regardless of the position of the light emitting surface 602 of the optical member 60. The wavelength conversion member 70 is formed so as to have a uniform thickness along the normal direction regardless of the position. The wavelength conversion member 70 is fixed to the mounting board 20 by using, for example, an adhesive agent (e.g., silicone resin, epoxy resin, or the like).

The light emitted from the LED chip 10 enters the wavelength conversion member 70 from the light incident surface 701, and is outputted from the wavelength conversion member 70 through a light emitting surface 702 (surface opposite to the LED chip 10 side) of the wavelength conversion member 70. The light is partially wavelength-converted by the phosphor particles in the wavelength conversion member 70 when the light passes through the wavelength conversion member 70. Thereby, light of a color depending on the combination of the light emitted from the LED chip 10 and the type of the phosphor particles in the wavelength conversion member 70 is emitted from the light emitting device 1.

Figure 3:
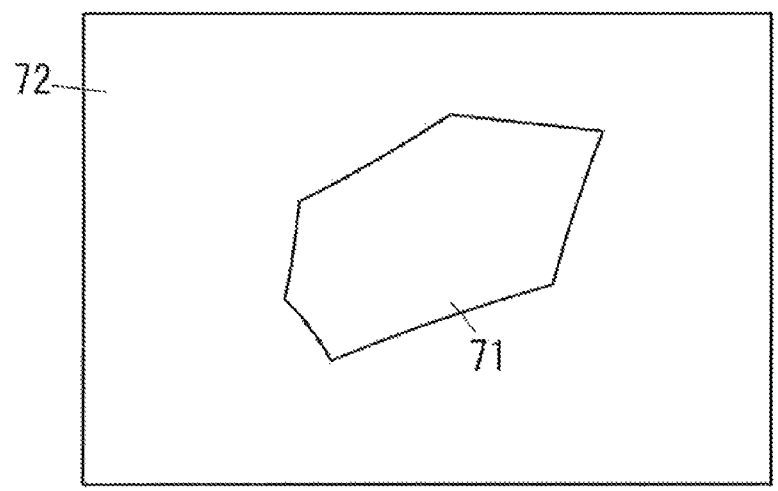
FIG. 3 is a schematic diagram showing an internal structure of a wavelength conversion member included in the light emitting device.

As shown in FIG. 3, the wavelength conversion member 70 includes an optically-transparent medium 72, and a plurality of phosphor particles 71 dispersed in the optically-transparent medium 72. At least a part of the phosphor particles 71 is formed of the phosphor according to the present embodiment.

The wavelength conversion member 70 may contain, together with phosphor particles formed of the phosphor according to the present embodiment, phosphor particles other than the phosphor particles formed of the phosphor according to the present embodiment as the phosphor particles 71.

In the case where the light emitting device 1 emits white light, if a blue LED chip that emits blue light is used as the LED chip 10 in the light emitting device 1, the wavelength conversion member 70 contains, as the phosphor particles 71, red phosphor particles together with green phosphor particles formed of the phosphor according to the present embodiment, for example. In this case, the blue light, which is emitted from the LED chip 10 without being wavelength-converted, and the light, which is wavelength-converted by the red phosphor particles and the green phosphor particles in the wavelength conversion member 70, are emitted from the wavelength conversion member 70. Thereby, white light is emitted from the light emitting device 1. In this case, examples of phosphors constituting the red phosphor particles include a phosphor having compositions such as $(Ca, Sr)_2Si_5N_8:Eu^{2+}$, $(Ca, Sr)AlSiN_3:Eu^{2+}$, and $CaS:Eu^{2+}$. Another green phosphor particles may be combined with the green phosphor particles formed of the phosphor according to the present embodiment. In this case, examples of phosphors, constituting the green phosphor particles, other than the phosphor according to the present embodiment include a phosphor having compositions such as $(Ba, Sr)_2SiO_4:Eu^{2+}$, $Y_3Al_5O_{12}:Ce^{3+}$, $(Ba, Sr, Ca)Si_2O_2N_2:Eu^{2+}$, $(Ca, Mg)_3Sc_2Si_3O_{12}:Ce^{3+}$, or $CaSc_2O_4:Ce^{3+}$. The manner of selecting the phosphor particles 71 in order to cause the light emitting device 1 to emit white light is not limited to the above-described manner. For example, the wavelength conversion member 70 may contain the green phosphor particles formed of the phosphor according to the present embodiment, yellow phosphor particles, and orange phosphor particles.

In the case where the light emitting device 1 emits white light, if an ultraviolet LED chip that emits ultraviolet light is used as the LED chip 10 in the light emitting device 1, the wavelength conversion member 70 contains, as the phosphor particles 71, red phosphor particles and blue phosphor particles together with green phosphor particles formed of the phosphor according to the present embodiment, for example. In this case, examples of phosphors constituting the red phosphor particles include a phosphor having compositions such as $La_2O_2S:Eu^{3+}$, $(Ca, Sr)_2Si_5N_8:Eu^{2+}$, and $(Ca, Sr)AlSiN_3:Eu^{2+}$. Examples of phosphors constituting the blue phosphor particles include a phosphor having compositions such as $BaMgAl_{10}O_{17}:Eu^{2+}$, $(Sr, Ca, Ba)_{10}(PO_4)_6Cl_2:Eu^{2+}$, and $Sr_3MgSi_2O_8:Eu^{2+}$. Another green phosphor particles may be combined with the green phosphor particles formed of the phosphor according to the present embodiment. In this case, examples of phosphors constituting the green phosphor particles other than the phosphor according to the present embodiment include a phosphor having compositions such as $(Ba, Sr)_2SiO_4:Eu^{2+}$, $BaMgAl_{10}O_{17}:Eu^{2+}, Mn^{2+}$, and $(Ba, Sr, Ca)Si_2O_2N_2:Eu^{2+}$.

The particle diameter of the phosphor particles 71 is not particularly limited. However, a larger average particle diameter of the phosphor particles 71 reduces the defect density in the phosphor particle 71, thereby reducing the energy loss at emitting and improving the luminous efficiency. Therefore, from the standpoint of improving the luminous efficiency, the phosphor particles 71 preferably have an average particle diameter of 1 μm or more, and more preferably 5 μm or more. The average particle diameter is measured by a laser diffraction/scattering type particle size distribution measuring apparatus.

The phosphor particles 71 may be subjected to an appropriate surface treatment such as coating, in order to suppress the reflection of excitation light or fluorescence at the boundary between each phosphor particle 71 and the optically-transparent medium 72.

The refractive index of the optically-transparent medium 72 is preferably close to the refractive index of the phosphor particles 71, but the present invention is not limited thereto. Examples of materials of the optically-transparent medium 72 include a silicon compound having a siloxane bond, and a glass. Since these materials are excellent in heat resistance and light resistance (durability against the light having a short wavelength in a range from blue light to ultraviolet light or the like), the optically-transparent medium 72 is suppressed from being deteriorated by light in a wavelength range from blue light to ultraviolet light which are excitation lights of the phosphor particles 71. Examples of the silicon compound include silicone resin, and a composite resin generated by cross-linking an organosiloxane hydrolysis-condensation product, an organosiloxane condensation product, and the like in a known polymerization method (addition polymerization such as hydrosilylation, radical polymerization, or the like). Examples of materials of the optically-transparent medium 72 may include acrylic resin, and an organic-inorganic hybrid material which is formed by mixing and combining an organic component and an inorganic component at the nanometer level or molecular level.

The content of the phosphor particles 71 in the wavelength conversion member 70 is appropriately determined by taking into consideration of the types of the phosphor particles 71 and the optically-transparent medium 72, the size of the wavelength conversion member 70, the wavelength conversion performance required of the wavelength conversion member 70, and the like. For example, the content of the phosphor particles 71 is in a range from 5% by weight to 30% by weight.

When the wavelength conversion member 70 is irradiated with the excitation light for the phosphor particles 71, the phosphor particles 71 absorb the excitation light, and emit fluorescence having a wavelength longer than the wavelength of the excitation light. Thus, when light passes through the wavelength conversion member 70, the wavelength of the light is converted by the phosphor particles 71.

EXAMPLES

Example 1

A phosphor (NaBaScSi$_2$O$_7$:Eu$^{2+}$) having a composition in which A, M and L were Na, Ba and Sc, respectively, and a and b were 0.01 and 0, respectively, in general formula (1) was synthesized as follows.

First, each powder of Na$_2$CO$_3$, BaCO$_3$, Eu$_2$O$_3$, Sc$_2$O$_3$, and SiO$_2$ was weighted and blended at a molar ratio of 1.0:1.98:0.01:1.0:4.0, and mixed by using a ball mill to obtain a mixture powder.

The mixture powder was put into an alumina crucible, and heated for twelve hours at 1100° C. in atmosphere, thereby the calcinating was performed. A sintered body obtained by the calcinating was grinded. Thus obtained powder was put in an alumina crucible, and heated for twelve hours at 1110° C. in a hydrogen/argon mixture gas atmosphere in which the concentration of hydrogen is 5%, thereby the burning was performed. A sintered body obtained by the burning was grinded to obtain phosphor particles.

Examples 2 to 6

By varying the composition of the raw materials for manufacturing the phosphor of Example 1, phosphors each of which had a composition shown in Table 1 were manufactured. As raw materials not used in Example 1, Li$_2$CO$_3$ as a Li compound, SrCO$_3$ as a Sr compound, Y$_2$O$_3$ as a Y compound, and GeO$_2$ as a Ge compound were used.

[Evaluation]

Figure 4:
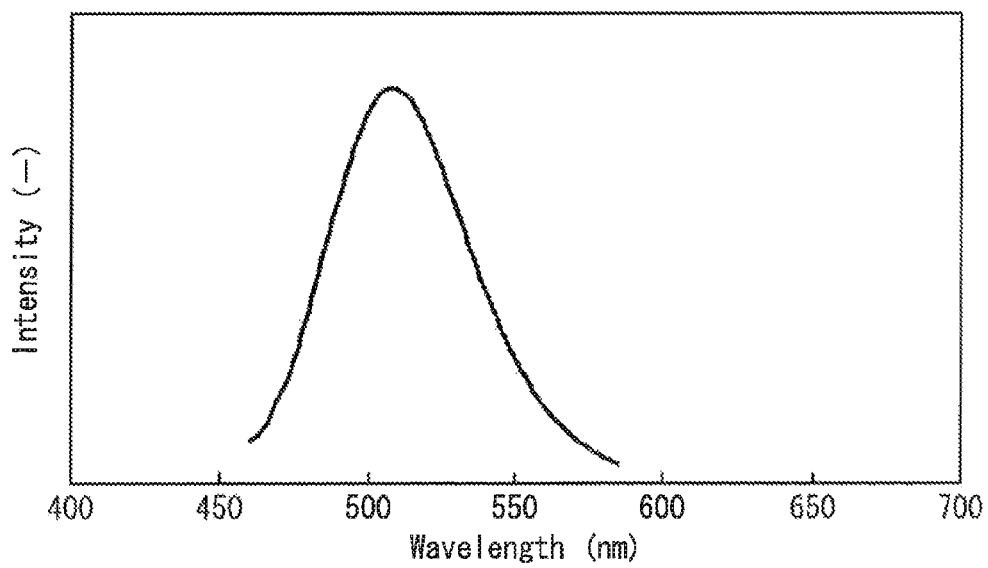
FIG. 4 is a graph showing an emission spectrum of fluorescence from a phosphor according to Example 1 of the present invention.

Emission spectra of fluorescence emitted from the phosphors obtained in Examples 1 to 6 were measured. A spectrofluorophotometer FP-6500 manufactured by JASCO corporation was used as a measurement device. The wavelength of excitation light applied to the phosphors was 450 nm. As the result, the emission spectra of the phosphors obtained in Examples 1 to 6 have peak wavelengths shown in Table 1, and these emission spectra were broad spectra around the corresponding peak wavelengths. The color of the fluorescence emitted from the phosphors was green. FIG. 4 shows the emission spectrum of the phosphor obtained in Example 1.

Emission intensities of fluorescence emitted from the phosphors obtained in Examples 1 to 6 are also shown in Table 1. The emission intensities, which individually exhibit the intensities at the peak wavelengths of the emission spectra, indicate values (relative emission intensities) normalized such that the emission intensity of the phosphor obtained in Example 1 is defined as a value of 100.

Figure 5:
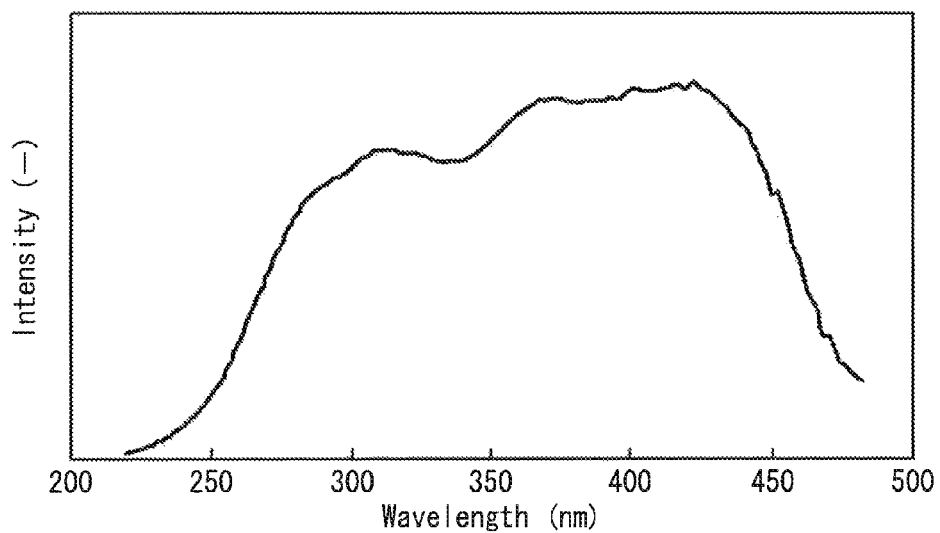
FIG. 5 is a graph showing an excitation spectrum of the phosphor according to Example 1 of the present invention.

Excitation spectra of the phosphors obtained in Examples 1 to 6 were also measured simultaneously by using the above-described device. The peak wavelengths of the emission spectra were used as monitor wavelengths. As the result, it was observed that the waveform of the excitation spectrum of each of the phosphors was relatively flat from the near-ultraviolet region to the blue region, and therefore, variation in the emission intensity was small in the range from the near-ultraviolet region to the blue region even when the wavelength of the excitation light varied. FIG. 5 shows the excitation spectrum of the phosphor obtained in Example 1.

TABLE 1

| Composition | Relative emission intensity | Emission peak wavelength |
|---|---|---|
| Example 1 NaBa$_{0.99}$Eu$_{0.01}$ScSi$_2$O$_7$ | 100 | 505 nm |
| Example 2 Na$_{0.7}$Li$_{0.3}$Ba$_{0.99}$Eu$_{0.01}$ScSi$_2$O$_7$ | 168 | 505 nm |
| Example 3 NaBa$_{0.99}$Eu$_{0.01}$Sc$_{0.9}$Y$_{0.1}$Si$_2$O$_7$ | 146 | 503 nm |
| Example 4 NaBa$_{0.89}$Sr$_{0.1}$Eu$_{0.01}$ScSi$_2$O$_7$ | 64 | 503 nm |
| Example 5 NaBa$_{0.99}$Eu$_{0.01}$Sc(Si$_{0.9}$Ge$_{0.1}$)$_2$O$_7$ | 94 | 503 nm |
| Example 6 NaBa$_{0.95}$Eu$_{0.05}$ScSi$_2$O$_7$ | 107 | 508 nm |

Examples 7 to 35

The raw materials were prepared to Li$_2$CO$_3$ powder as a raw material containing Li, Na$_2$CO$_3$ powder as a raw material containing Na, K$_2$CO$_3$ powder as a raw material containing K, BaCO$_3$ powder as a raw material containing Ba, CaCO$_3$ as a raw material containing Ca, SrCO$_3$ powder as a raw material containing Sr, MnCO$_3$ powder as a raw material containing Mn, Eu$_2$O$_3$ powder as a raw material containing Eu, Sc$_2$O$_3$ as a raw material containing Sc, Y$_2$O$_3$ powder as a raw material containing Y, and SiO$_2$ powder as a raw material containing Si, respectively.

These raw materials were blended and mixed to prepare a mixture. At this time, in Examples 7 to 11, the raw materials were blended so that the molar ratio of Na, Ba, Eu, Sc, and Si was 1:(1-a):a:1:2. In Examples 12 and 13, the raw materials were blended so that the molar ratio of Na, Ba, Sr, Eu, Sc, and Si was 1:p:q:a:1:2. In Example 14, the raw materials were blended so that the molar ratio of Na, Ba, Ca, Eu, Sc, and Si was 1:p:q:a:1:2. In Examples 15 to 18, the raw materials were blended so that the molar ratio of Na, Ba, Eu, Sc, Y, and Si was 1:(1-a):a:(1-z):z:2. In Examples 19 to 22, the raw materials were blended so that the molar ratio of Na, K, Ba, Eu, Sc, and Si was (1-y):y:(1-a):a:1:2. In Examples 23 to 27, the raw materials were blended so that the molar ratio of Na, Li, Ba, Eu, Sc, and Si was (1-y):y:(1-a):a:1:2. In Examples 28 to 31, the raw materials were blended so that the molar ratio of Na, Ba, Eu, Mn, Sc, and Si was 1:(0.93-x):0.07:x:1:2. In Examples 32 to 35, the raw materials were blended so that the molar ratio of Li, Na, Ba, Mn, Eu, Sc, and Si was 0.7:0.3:(0.93-x):0.07:x:1:2.

Specific molar ratios of the metal elements and specific values of a, p, q, y, and z in the respective Examples are shown in Table 2 and Table 3, respectively.

TABLE 2

| | Molar ratio | | | | | | | | | |
|---|---|---|---|---|---|---|---|---|---|---|
| | Li | Na | K | Ba | Ca | Sr | Eu | Mn | Sc | Y | Si |
| Example 7 | 0 | 1 | 0 | 0.99 | 0 | 0 | 0.01 | 0 | 1 | 0 | 2 |
| Example 8 | 0 | 1 | 0 | 0.97 | 0 | 0 | 0.03 | 0 | 1 | 0 | 2 |
| Example 9 | 0 | 1 | 0 | 0.95 | 0 | 0 | 0.05 | 0 | 1 | 0 | 2 |
| Example 10 | 0 | 1 | 0 | 0.93 | 0 | 0 | 0.07 | 0 | 1 | 0 | 2 |

TABLE 2-continued

| | Molar ratio | | | | | | | | | | |
|---|---|---|---|---|---|---|---|---|---|---|---|
| | Li | Na | K | Ba | Ca | Sr | Eu | Mn | Sc | Y | Si |
| Example 11 | 0 | 1 | 0 | 0.9 | 0 | 0 | 0.1 | 0 | 1 | 0 | 2 |
| Example 12 | 0 | 1 | 0 | 0.89 | 0 | 0.1 | 0.01 | 0 | 1 | 0 | 2 |
| Example 13 | 0 | 1 | 0 | 0.69 | 0 | 0.3 | 0.01 | 0 | 1 | 0 | 2 |
| Example 14 | 0 | 1 | 0 | 0.89 | 0.1 | 0 | 0.01 | 0 | 1 | 0 | 2 |
| Example 15 | 0 | 1 | 0 | 0.99 | 0 | 0 | 0.01 | 0 | 0.95 | 0.05 | 2 |
| Example 16 | 0 | 1 | 0 | 0.99 | 0 | 0 | 0.01 | 0 | 0.9 | 0.1 | 2 |
| Example 17 | 0 | 1 | 0 | 0.99 | 0 | 0 | 0.01 | 0 | 0.7 | 0.3 | 2 |
| Example 18 | 0 | 1 | 0 | 0.99 | 0 | 0 | 0.01 | 0 | 0.5 | 0.5 | 2 |
| Example 19 | 0 | 0.95 | 0.05 | 0.99 | 0 | 0 | 0.01 | 0 | 1 | 0 | 2 |
| Example 20 | 0 | 0.9 | 0.1 | 0.99 | 0 | 0 | 0.01 | 0 | 1 | 0 | 2 |
| Example 21 | 0 | 0.7 | 0.3 | 0.99 | 0 | 0 | 0.01 | 0 | 1 | 0 | 2 |
| Example 22 | 0 | 0.5 | 0.5 | 0.99 | 0 | 0 | 0.01 | 0 | 1 | 0 | 2 |
| Example 23 | 0.05 | 0.95 | 0 | 0.99 | 0 | 0 | 0.01 | 0 | 1 | 0 | 2 |
| Example 24 | 0.3 | 0.7 | 0 | 0.99 | 0 | 0 | 0.01 | 0 | 1 | 0 | 2 |
| Example 25 | 0.7 | 0.3 | 0 | 0.99 | 0 | 0 | 0.01 | 0 | 1 | 0 | 2 |
| Example 26 | 0.3 | 0.7 | 0 | 0.93 | 0 | 0 | 0.07 | 0 | 1 | 0 | 2 |
| Example 27 | 0.7 | 0.3 | 0 | 0.93 | 0 | 0 | 0.07 | 0 | 1 | 0 | 2 |
| Example 28 | 0 | 1 | 0 | 0.92 | 0 | 0 | 0.07 | 0.01 | 1 | 0 | 2 |
| Example 29 | 0 | 1 | 0 | 0.9 | 0 | 0 | 0.07 | 0.03 | 1 | 0 | 2 |
| Example 30 | 0 | 1 | 0 | 0.88 | 0 | 0 | 0.07 | 0.05 | 1 | 0 | 2 |
| Example 31 | 0 | 1 | 0 | 0.86 | 0 | 0 | 0.07 | 0.07 | 1 | 0 | 2 |
| Example 32 | 0.7 | 0.3 | 0 | 0.92 | 0 | 0 | 0.07 | 0.01 | 1 | 0 | 2 |
| Example 33 | 0.7 | 0.3 | 0 | 0.9 | 0 | 0 | 0.07 | 0.03 | 1 | 0 | 2 |
| Example 34 | 0.7 | 0.3 | 0 | 0.88 | 0 | 0 | 0.07 | 0.05 | 1 | 0 | 2 |
| Example 35 | 0.7 | 0.3 | 0 | 0.86 | 0 | 0 | 0.07 | 0.07 | 1 | 0 | 2 |

TABLE 3

| | a | x | y | z | p | q |
|---|---|---|---|---|---|---|
| Example 7 | 0.01 | — | — | — | — | — |
| Example 8 | 0.03 | — | — | — | — | — |
| Example 9 | 0.05 | — | — | — | — | — |
| Example 10 | 0.07 | — | — | — | — | — |
| Example 11 | 0.1 | — | — | — | — | — |
| Example 12 | 0.01 | — | — | — | 0.89 | 0.1 |
| Example 13 | 0.01 | — | — | — | 0.69 | 0.3 |
| Example 14 | 0.01 | — | — | — | 0.89 | 0.1 |
| Example 15 | 0.01 | — | — | 0.05 | — | — |
| Example 16 | 0.01 | — | — | 0.1 | — | — |
| Example 17 | 0.01 | — | — | 0.3 | — | — |
| Example 18 | 0.01 | — | — | 0.5 | — | — |
| Example 19 | 0.01 | — | 0.05 | — | — | — |
| Example 20 | 0.01 | — | 0.1 | — | — | — |
| Example 21 | 0.01 | — | 0.3 | — | — | — |
| Example 22 | 0.01 | — | 0.5 | — | — | — |
| Example 23 | 0.01 | — | 0.05 | — | — | — |
| Example 24 | 0.01 | — | 0.3 | — | — | — |
| Example 25 | 0.01 | — | 0.7 | — | — | — |
| Example 26 | 0.07 | — | 0.3 | — | — | — |
| Example 27 | 0.07 | — | 0.7 | — | — | — |
| Example 28 | 0.07 | 0.01 | — | — | — | — |
| Example 29 | 0.07 | 0.03 | — | — | — | — |
| Example 30 | 0.07 | 0.05 | — | — | — | — |
| Example 31 | 0.07 | 0.07 | — | — | — | — |
| Example 32 | 0.07 | 0.01 | — | — | — | — |
| Example 33 | 0.07 | 0.03 | — | — | — | — |
| Example 34 | 0.07 | 0.05 | — | — | — | — |
| Example 35 | 0.07 | 0.07 | — | — | — | — |

The mixture was put in an alumina crucible, and heated for twelve hours at 1100° C. in the atmosphere, thereby the calcinating was performed. A sintered body obtained by the calcinating was grinded. Thus obtained powder was put in an alumina crucible, and heated for twelve hours at 1110° C. in a hydrogen/argon mixture gas atmosphere in which the concentration of hydrogen is 5%, thereby the burning was performed. A sintered body obtained by the burning was grinded to obtain phosphor particles.

[X-ray Diffraction Measurement]

Figure 6:
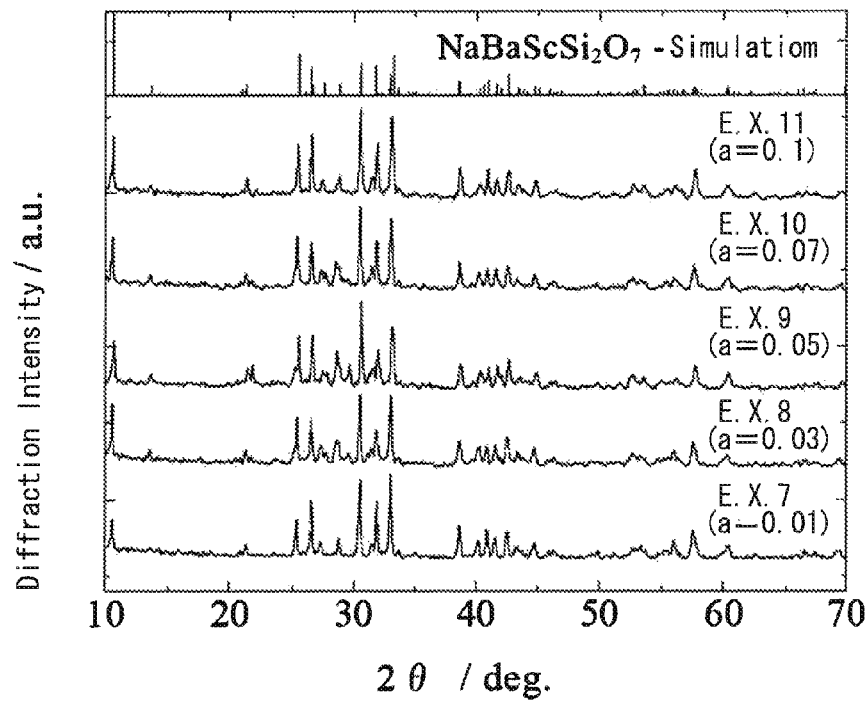
FIG. 6 is a graph showing diffraction intensity profiles obtained by performing X-ray powder diffraction measurement of phosphor particles obtained in Examples 7 to 11, and a diffraction intensity profile of $NaBaScSi_2O_7$ obtained by simulation.
Figure 7:
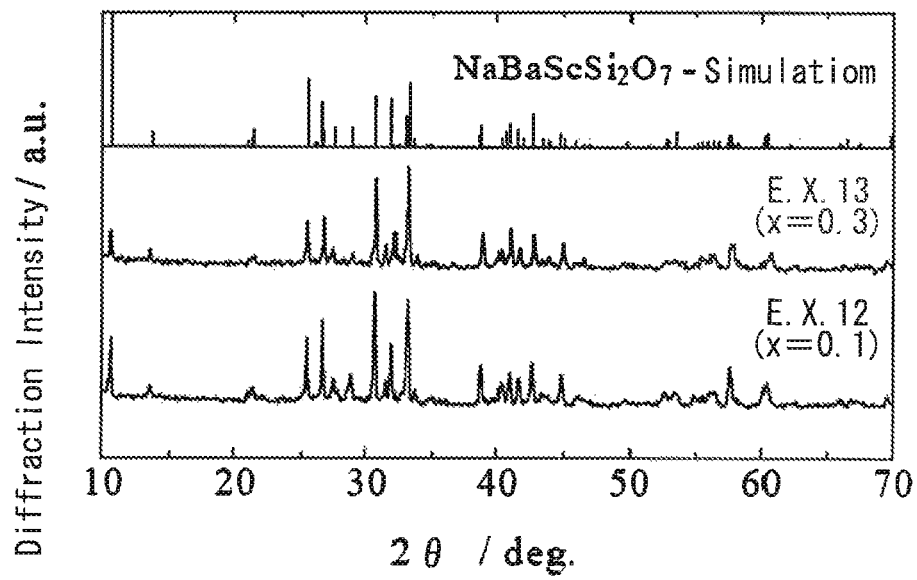
FIG. 7 is a graph showing diffraction intensity profiles obtained by performing X-ray powder diffraction measurement of phosphor particles obtained in Examples 12 and 13, and a diffraction intensity profile of $NaBaScSi_2O_7$ obtained by simulation.
Figure 8:
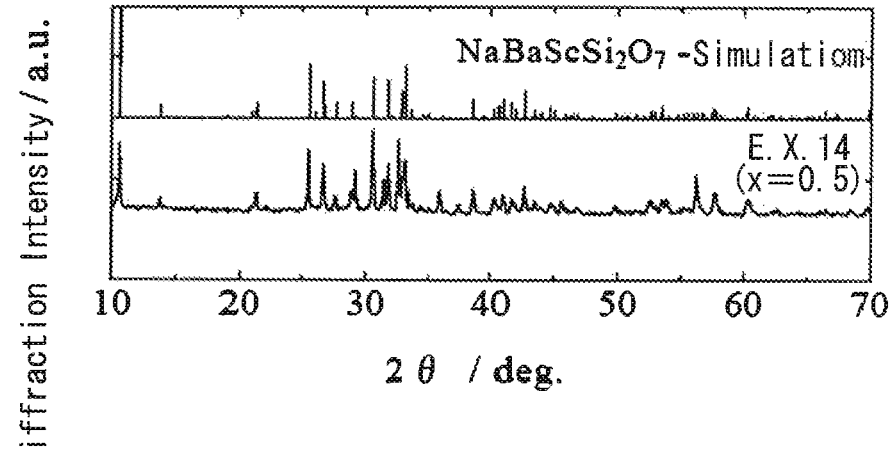
FIG. 8 is a graph showing a diffraction intensity profile obtained by performing X-ray powder diffraction measurement of phosphor particles obtained in Example 14, and a diffraction intensity profile of $NaBaScSi_2O_7$ obtained by simulation.
Figure 9:
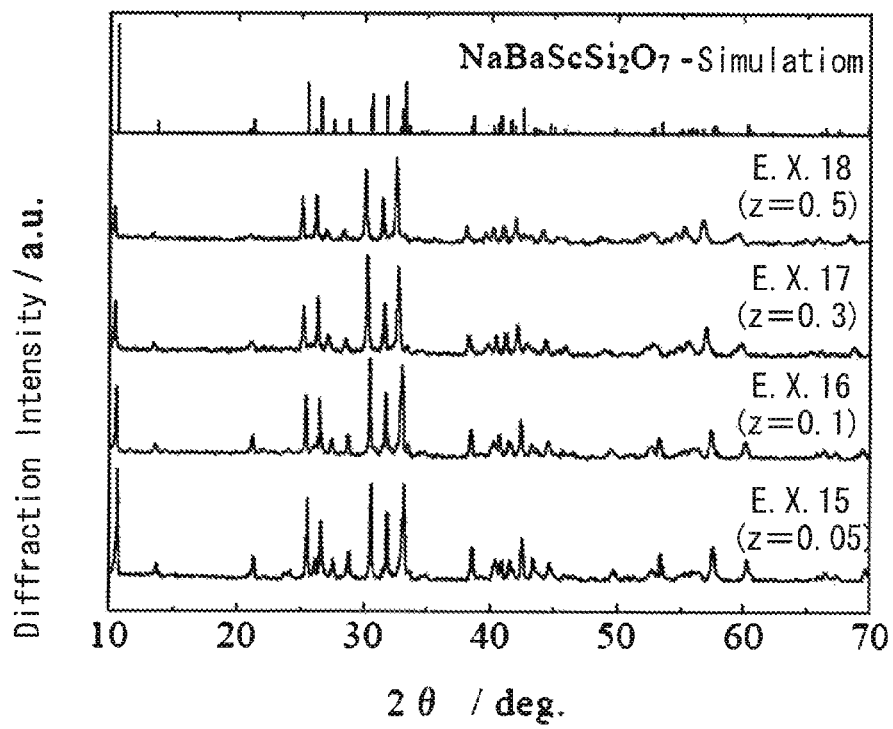
FIG. 9 is a graph showing diffraction intensity profiles obtained by performing X-ray powder diffraction measurement of phosphor particles obtained in Examples 15 to 18, and a diffraction intensity profile of $NaBaScSi_2O_7$ obtained by simulation.
Figure 10:
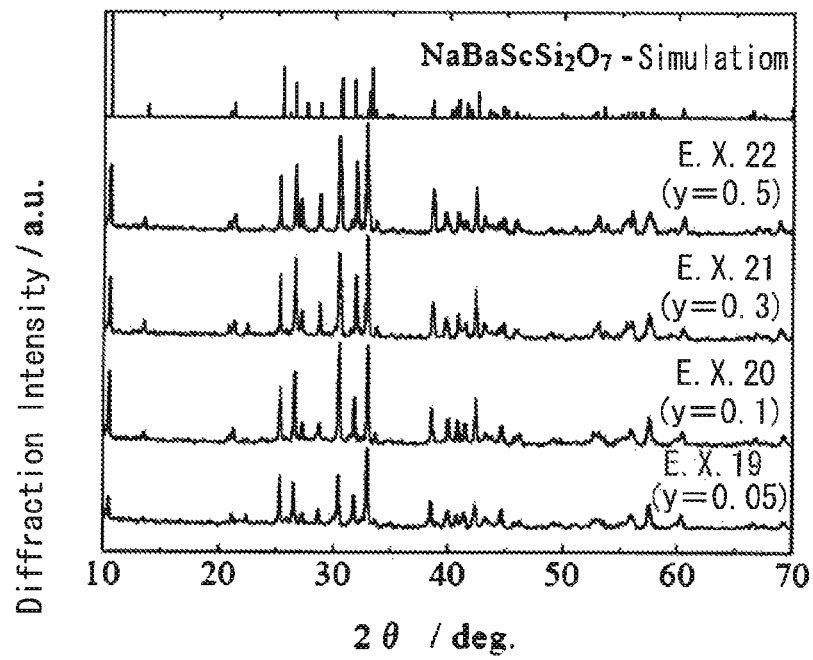
FIG. 10 is a graph showing diffraction intensity profiles obtained by performing X-ray powder diffraction measurement of phosphor particles obtained in Examples 19 to 22, and a diffraction intensity profile of $NaBaScSi_2O_7$ obtained by simulation.
Figure 11:
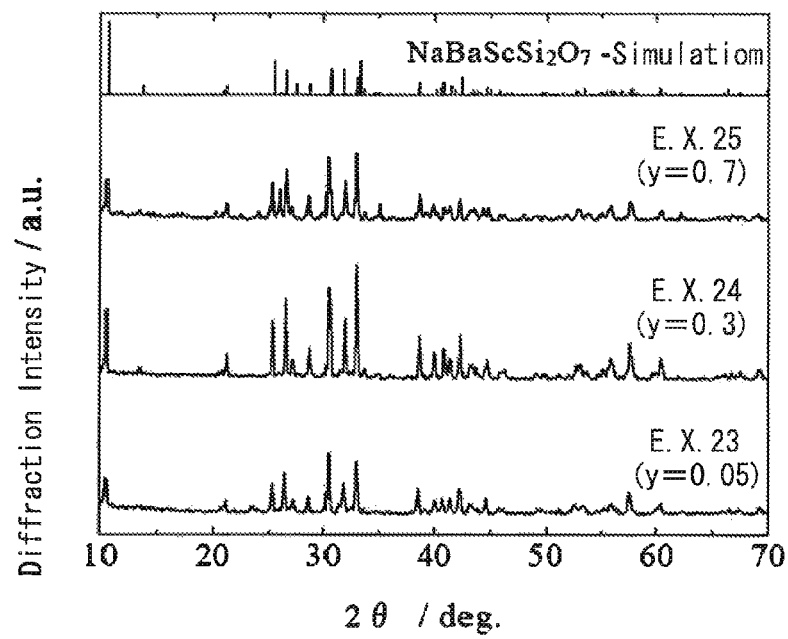
FIG. 11 is a graph showing diffraction intensity profiles obtained by performing X-ray powder diffraction measurement of phosphor particles obtained in Examples 23 to 25, and a diffraction intensity profile of $NaBaScSi_2O_7$ obtained by simulation.

The particles of the phosphors obtained in Examples 7 to 25 were subjected to X-ray powder diffraction measurement using a CuKα ray. The results of Examples 7 to 11 are shown in FIG. 6, the results of Examples 12 and 13 are shown in FIG. 7, the result of Example 14 is shown in FIG. 8, the results of Examples 15 to 18 are shown in FIG. 9, the results of Examples 19 to 22 are shown in FIG. 10, and the results of Examples 23 to 25 are shown in FIG. 11. Further, as a reference, a diffraction intensity profile of $NaBaScSi_2O_7$ obtained by simulation is also shown in FIGS. 7 to 11.

[Evaluation of Emission Characteristics]

Excitation spectra and emission spectra of the particles of the phosphors obtained in Examples 7 to 27 were measured. The spectrofluorophotometer FP-6500 manufactured by JASCO corporation was used as a measurement device.

When measuring the emission spectra, the wavelength of the excitation light was set at 450 nm. When measuring the excitation spectra, a wavelength at which the emission intensity of the emission spectrum attains a maximum value in each Example was used as a monitor wavelength.

As the result, in any of the phosphor particles obtained in Examples 7 to 27, the peak wavelength in the emission spectrum was about 500 nm, and the color of fluorescence emitted from each phosphor particle was green. Furthermore, it was observed that, in any of the phosphor particles obtained in Examples 7 to 27, the waveform of the excitation spectrum was relatively flat from the near-ultraviolet region to the blue region, and therefore, variation in the emission intensity was small in the range from the near-ultraviolet region to the blue region even when the wavelength of the excitation light varied.

Figure 12:
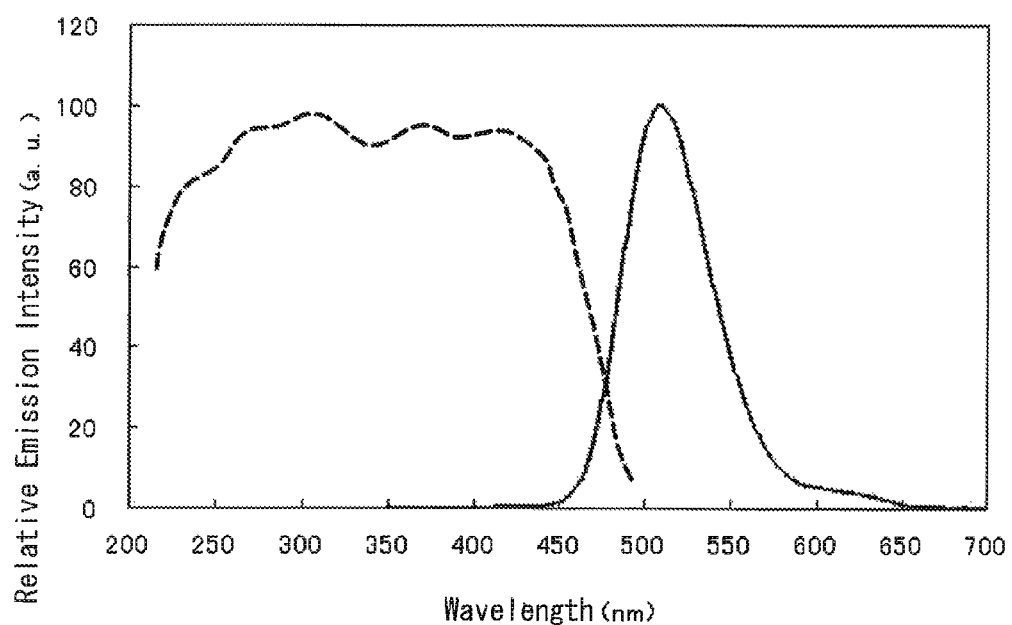
FIG. 12 is a graph showing the measurement results of an excitation spectrum and an emission spectrum of the phosphor particles obtained in Example 12.

FIG. 12 shows the emission spectrum (solid line) and the excitation spectrum (dashed line) of the phosphor particle obtained in Example 27. The emission intensity shown in FIG. 12 is a value (relative emission intensity) normalized with the emission intensity at the peak wavelength being 100.

Figure 13:
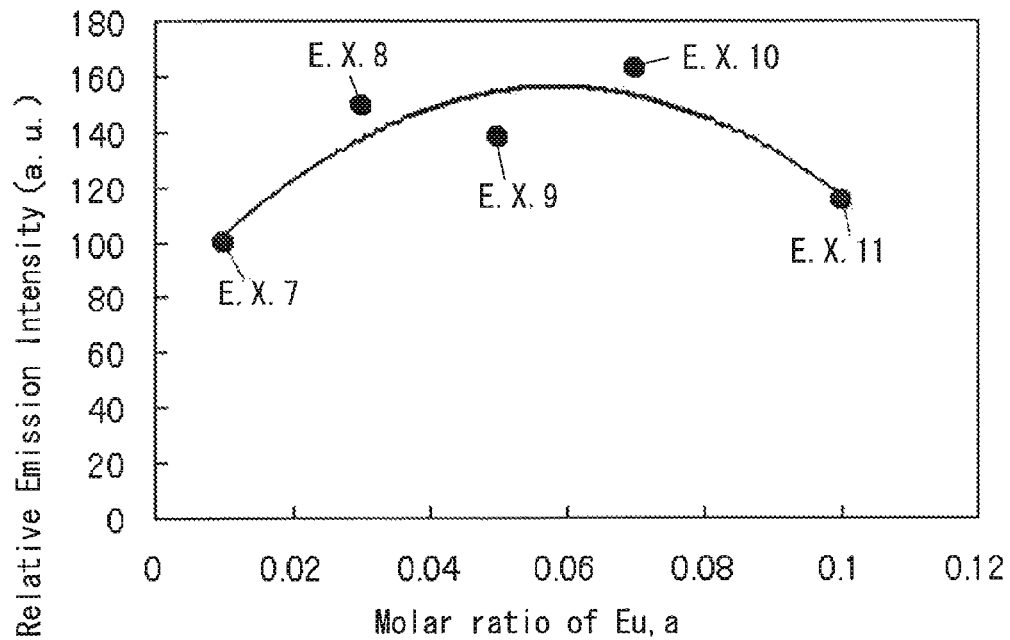
FIG. 13 is a graph showing emission intensities at emission peak wavelengths in emission spectra according to Examples 7 to 11.

Table 4 and FIG. 13 show the emission intensities at the emission peak wavelengths in the emission spectra in Examples 7 to 11. The emission intensities are values (relative emission intensities) normalized with the value of the emission intensity of the phosphor obtained in Example 7 being 100.

TABLE 4

| | Molar ratio | | | | | Relative emission |
|---|---|---|---|---|---|---|
| | Na | Ba | Eu | Sc | Si | intensity |
| Example 7 | 1 | 1 | 0 | 1 | 2 | 100 |
| Example 8 | 1 | 1 | 0 | 1 | 2 | 150 |
| Example 9 | 1 | 1 | 0.1 | 1 | 2 | 138 |
| Example 10 | 1 | 0.9 | 0.1 | 1 | 2 | 163 |
| Example 11 | 1 | 0.9 | 0.1 | 1 | 2 | 115 |

Table 5 shows the emission intensities at the emission peak wavelengths in the emission spectra in Examples 7, and 12 to 14. The emission intensities are values (relative emission intensities) normalized with the value of the emission intensity of the phosphor obtained in Example 7 being 100.

TABLE 5

| | Molar ratio | | | | | | Relative emission |
|---|---|---|---|---|---|---|---|
| | Na | Ba | Ca | Sr | Eu | Sc | Si | intensity |
| Example 7 | 1 | 0.99 | 0 | 0 | 0.01 | 1 | 2 | 100 |
| Example 12 | 1 | 0.89 | 0 | 0.1 | 0.01 | 1 | 2 | 43 |
| Example 13 | 1 | 0.69 | 0 | 0.3 | 0.01 | 1 | 2 | 27 |
| Example 14 | 1 | 0.89 | 0.1 | 0 | 0.01 | 1 | 2 | 53 |

Figure 14:
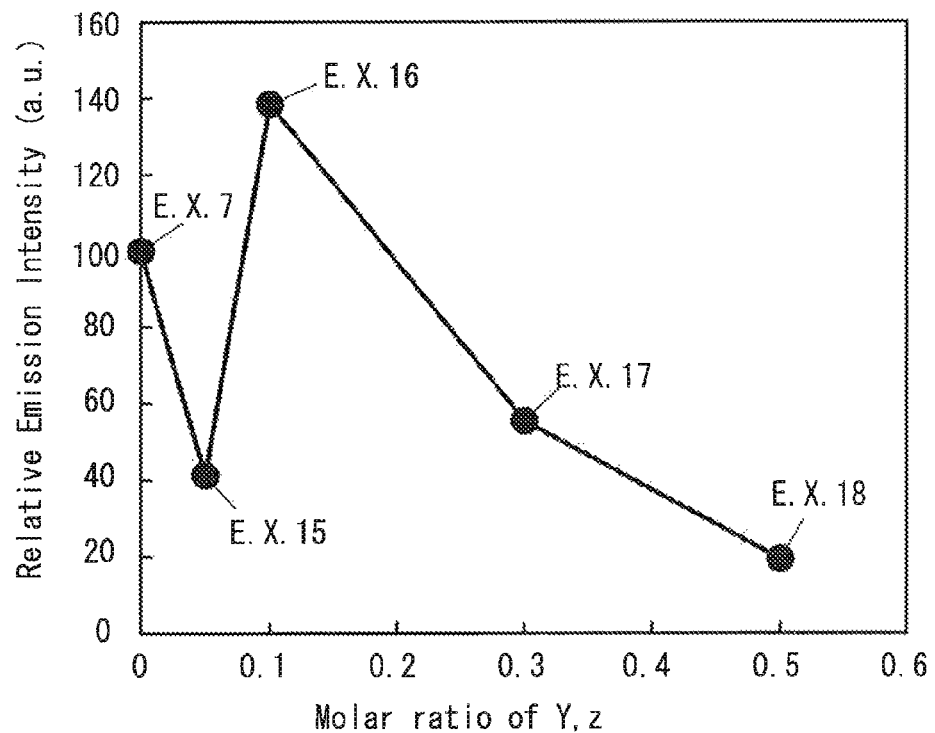
FIG. 14 is a graph showing emission intensities at emission peak wavelengths in emission spectra according to Examples 15 to 18.

Table 6 and FIG. 14 show the emission intensities at the emission peak wavelengths in the emission spectra in Examples 7, and 15 to 18. The emission intensities are values (relative emission intensities) normalized with the value of the emission intensity of the phosphor obtained in Example 7 being 100.

TABLE 6

| | Molar ratio | | | | | | Relative emission |
|---|---|---|---|---|---|---|---|
| | Na | Ba | Eu | Sc | Y | Si | intensity |
| Example 7 | 1 | 0.99 | 0.01 | 1 | 0 | 2 | 100 |
| Example 15 | 1 | 0.99 | 0.01 | 0.95 | 0.05 | 2 | 41 |
| Example 16 | 1 | 0.99 | 0.01 | 0.9 | 0.1 | 2 | 138 |
| Example 17 | 1 | 0.99 | 0.01 | 0.7 | 0.3 | 2 | 56 |
| Example 18 | 1 | 0.99 | 0.01 | 0.5 | 0.5 | 2 | 19 |

Figure 15:
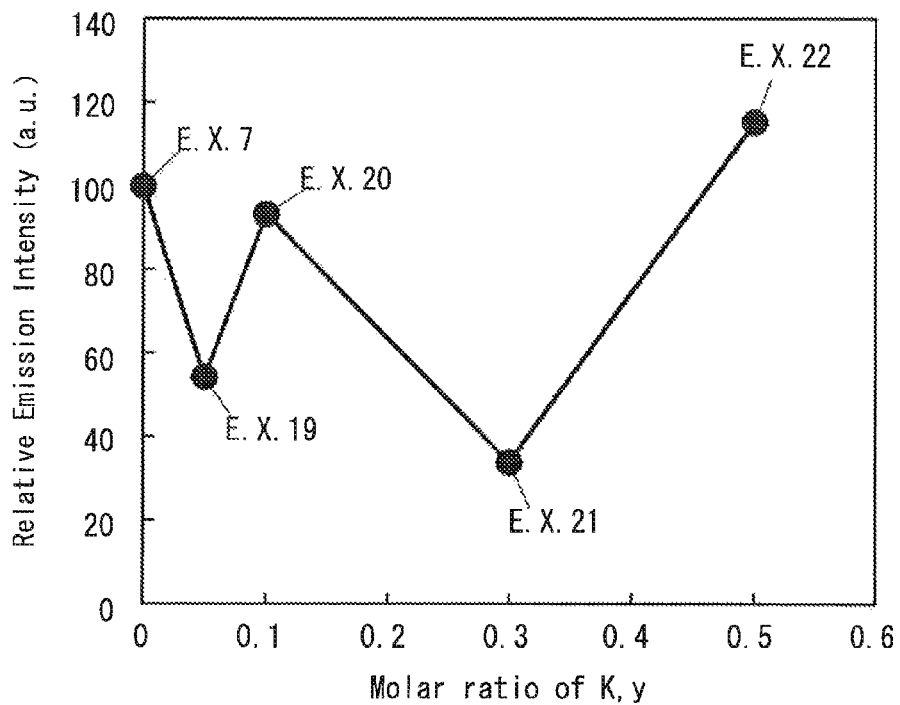
FIG. 15 is a graph showing emission intensities at emission peak wavelengths in emission spectra according to Examples 19 to 22.

Table 7 and FIG. 15 show the emission intensities at the emission peak wavelengths in the emission spectra in Examples 7, and 19 to 22. The emission intensities are values (relative emission intensities) normalized with the value of the emission intensity of the phosphor obtained in Example 7 being 100.

TABLE 7

| | Molar ratio | | | | | | Relative emission |
|---|---|---|---|---|---|---|---|
| | Na | K | Ba | Eu | Sc | Si | intensity |
| Example 7 | 1 | 0 | 0.99 | 0.01 | 1 | 2 | 100 |
| Example 19 | 0.95 | 0.05 | 0.99 | 0.01 | 1 | 2 | 54 |
| Example 20 | 0.9 | 0.1 | 0.99 | 0.01 | 1 | 2 | 93 |
| Example 21 | 0.7 | 0.3 | 0.99 | 0.01 | 1 | 2 | 34 |
| Example 22 | 0.5 | 0.5 | 0.99 | 0.01 | 1 | 2 | 115 |

Figure 16:
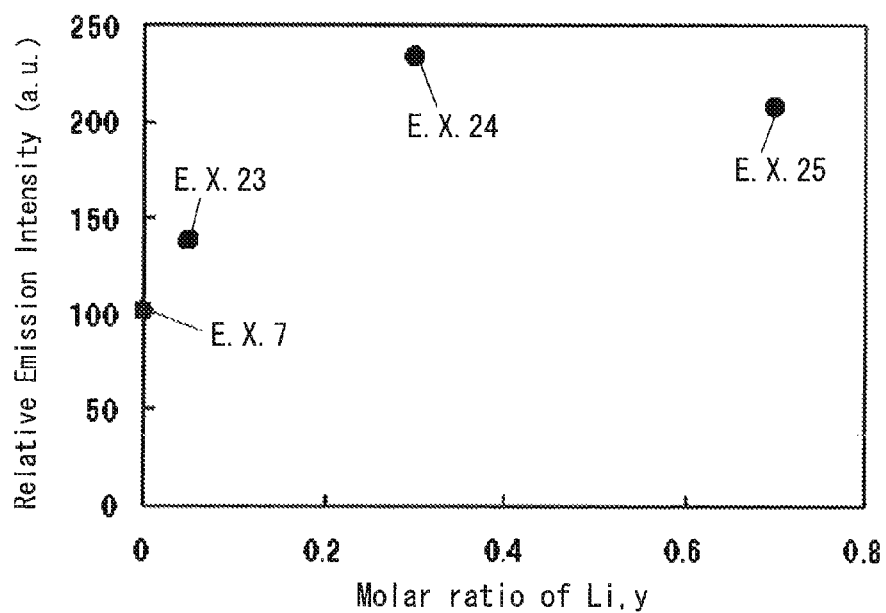
FIG. 16 is a graph showing emission intensities at emission peak wavelengths in emission spectra according to Examples 23 to 25.

FIG. 16 shows the emission intensities at the emission peak wavelengths in the emission spectra in Examples 7, and 23 to 25. The emission intensities are values (relative emission intensities) normalized with the value of the emission intensity of the phosphor obtained in Example 7 being 100.

Table 8 shows the emission intensities at the emission peak wavelengths in the emission spectra in Examples 10, 26, and 27. The emission intensities are values (relative emission intensities) normalized with the value of the emission intensity of the phosphor obtained in Example 7 being 100.

TABLE 8

| | Molar ratio | | | | | | Relative emission |
|---|---|---|---|---|---|---|---|
| | Li | Na | Ba | Eu | Sc | Si | intensity |
| Example 10 | 0 | 1 | 0.93 | 0.07 | 1 | 2 | 100 |
| Example 26 | 0.3 | 0.7 | 0.93 | 0.07 | 1 | 2 | 115 |
| Example 27 | 0.7 | 0.3 | 0.93 | 0.07 | 1 | 2 | 191 |

Although the composition of Example 9 is the same as that of Example 6, the emission intensity is higher in Example 9 than in Example 6. It is determined that the measurement result of Example 9 is more reliable because the measurement result of the emission intensity in Example 9 is higher in reproducibility.

Emission spectra of fluorescence emitted from the phosphors obtained in Examples 7 to 11 and Examples 28 to 35 were measured. The spectrofluorophotometer FP-6500 manufactured by JASCO corporation was used as a measurement device. The wavelength of excitation light applied to the phosphors was 450 nm.

Further, excitation spectra of the phosphors obtained in Examples 7 to 11 were also measured simultaneously by using the above-described device. The peak wavelength of the emission spectrum of each phosphor was used as a monitor wavelength. As the result, it was observed that the waveform of the excitation spectrum of each of the phosphors was relatively flat from the near-ultraviolet region to the blue region, and therefore, variation in the emission intensity was small in the range from the near-ultraviolet region to the blue region even when the wavelength of the excitation light varied.

Figure 17:
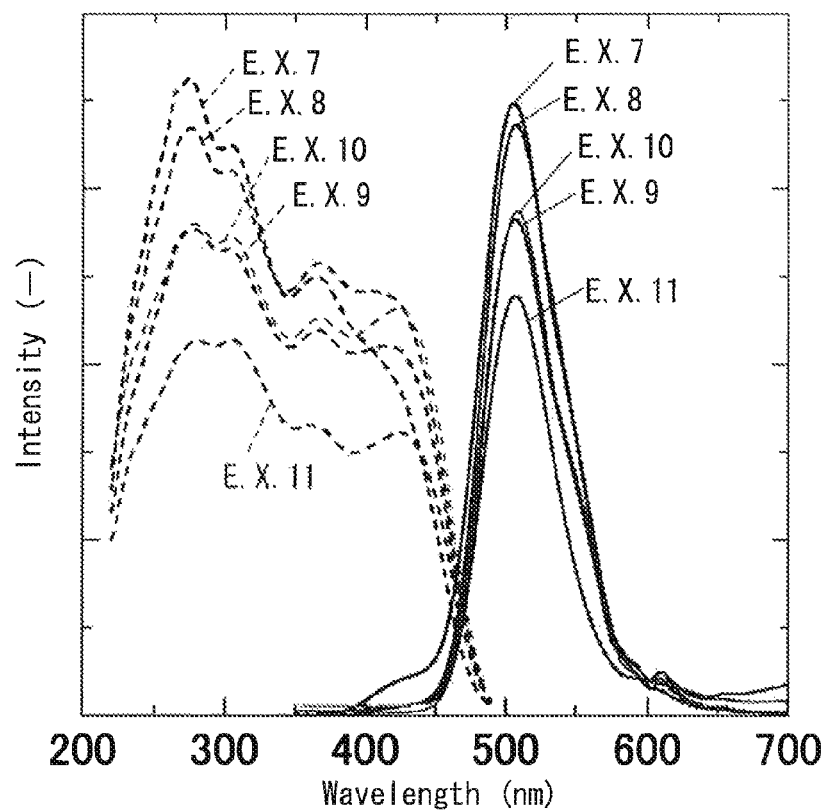
FIG. 17 is a graph showing the measurement results of excitation spectra and emission spectra of the phosphor particles obtained in Examples 7 to 11.
Figure 18:
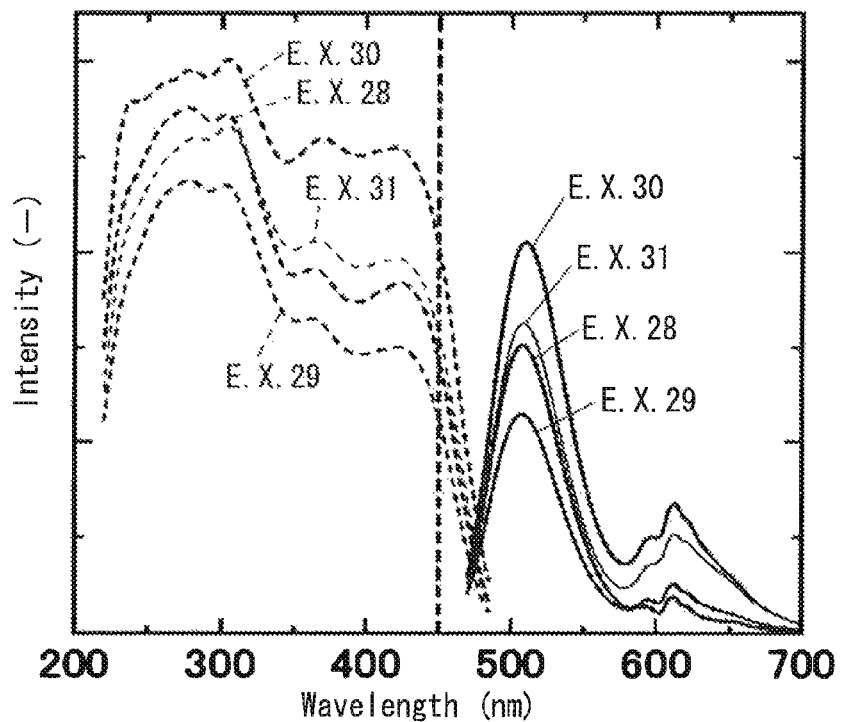
FIG. 18 is a graph showing the measurement results of excitation spectra and emission spectra of the phosphor particles obtained in Examples 28 to 31.
Figure 19:
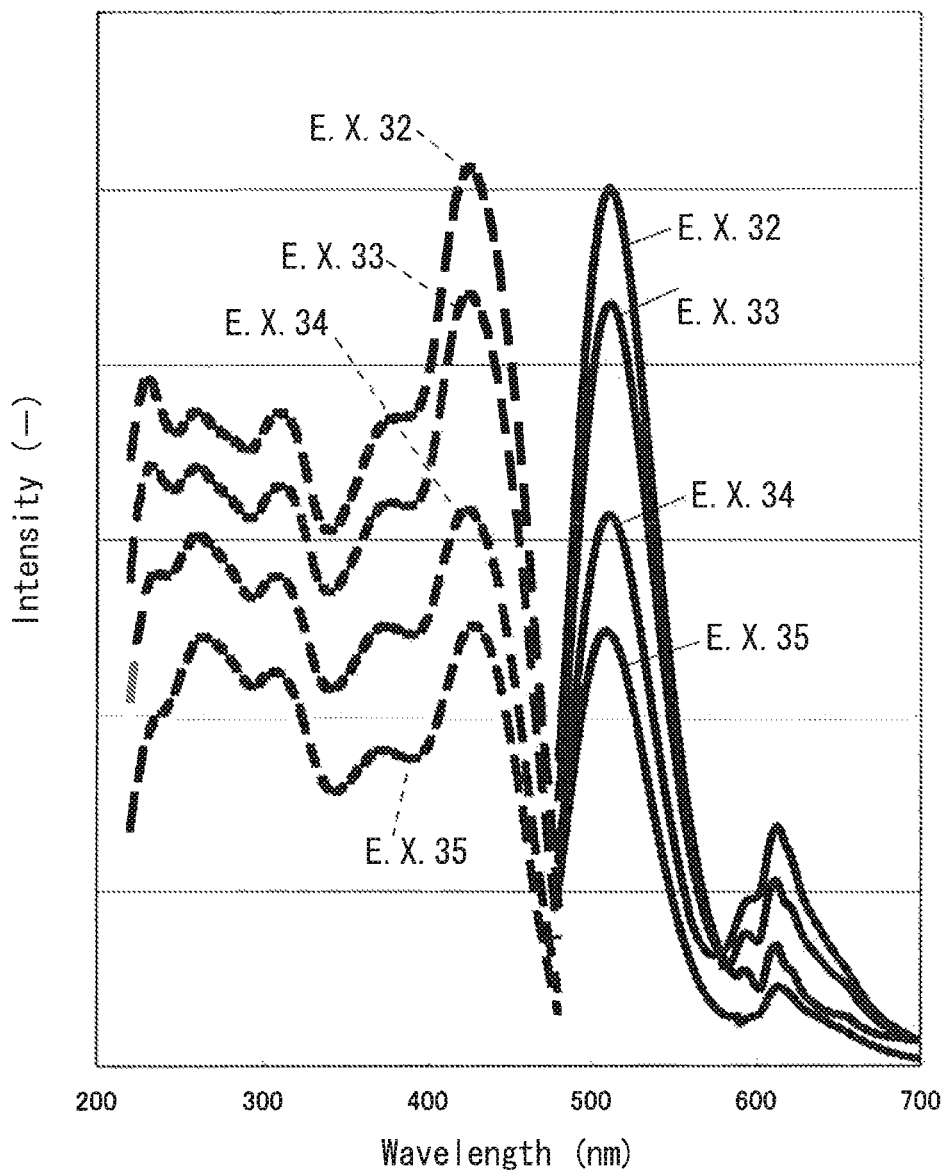
FIG. 19 is a graph showing the measurement results of excitation spectra and emission spectra of the phosphor particles obtained in Examples 32 to 35.

FIG. 17 shows the emission spectra (solid lines) and the excitation spectra (dashed lines) of the phosphor particles obtained in Examples 7 to 11. FIG. 18 shows the emission spectra (solid lines) and the excitation spectra (dashed lines) of the phosphor particles obtained in Examples 28 to 31. FIG. 19 shows the emission spectra (solid lines) and the excitation spectra (dashed lines) of the phosphor particles obtained in Examples 32 to 35.

According to the results, the peak wavelengths of the emission spectra of the phosphor particles obtained in Examples 7 to 11 and Examples 28 to 31 were about 500 nm, and the color of the fluorescence emitted from the phosphor particles was green. Further, it was observed that the waveform of the excitation spectrum of each of the phosphor particles was relatively flat from the near-ultraviolet region to the blue region, and therefore, the variation in the emission intensity was small in the range from the near-ultraviolet region to the blue region even when the wavelength of the excitation light varied.

Furthermore, in the emission spectra of the phosphor particles obtained in Examples 28 to 31, a relatively small peak was observed in the red wavelength region of about 610 nm. Accordingly, improvement of the color rendering property of the light emitting device can be expected by using any of the phosphors of Examples 28 to 31.

Table 9 shows the emission intensities at the emission peak wavelengths in the emission spectra of the phosphors obtained in Examples 7 to 11 and Examples 28 to 35. The emission intensities are values (relative emission intensities)

normalized with the value of the emission intensity of the phosphor obtained in Example 7 being 100.

Further, Table 9 also shows the ratio of the intensity of the maximum peak in the red region to the intensity of the maximum peak in the green region, with respect to the phosphors obtained in Examples 28 to 35.

TABLE 9

| | Molar ratio | | | | | | | Relative emission intensity | Red region/green region peak ratio |
|---|---|---|---|---|---|---|---|---|---|
| | Li | Na | Ba | Eu | Mn | Sc | Si | | |
| Example 7 | 0 | 1 | 0.99 | 0.01 | 0 | 1 | 2 | 100 | — |
| Example 8 | 0 | 1 | 0.97 | 0.03 | 0 | 1 | 2 | 150 | — |
| Example 9 | 0 | 1 | 0.95 | 0.05 | 0 | 1 | 2 | 138 | — |
| Example 10 | 0 | 1 | 0.93 | 0.07 | 0 | 1 | 2 | 163 | — |
| Example 11 | 0 | 1 | 0.9 | 0.1 | 0 | 1 | 2 | 115 | — |
| Example 28 | 0 | 1 | 0.92 | 0.07 | 0.01 | 1 | 2 | 140 | 0.125 |
| Example 29 | 0 | 1 | 0.9 | 0.07 | 0.03 | 1 | 2 | 100 | 0.223 |
| Example 30 | 0 | 1 | 0.88 | 0.07 | 0.05 | 1 | 2 | 256 | 0.456 |
| Example 31 | 0 | 1 | 0.86 | 0.07 | 0.07 | 1 | 2 | 174 | 0.429 |
| Example 32 | 0.7 | 0.3 | 0.92 | 0.07 | 0.01 | 1 | 2 | 379 | 0.138 |
| Example 33 | 0.7 | 0.3 | 0.9 | 0.07 | 0.03 | 1 | 2 | 322 | 0.244 |
| Example 34 | 0.7 | 0.3 | 0.88 | 0.07 | 0.05 | 1 | 2 | 222 | 0.437 |
| Example 35 | 0.7 | 0.3 | 0.86 | 0.07 | 0.07 | 1 | 2 | 178 | 0.184 |

DESCRIPTION OF THE REFERENCE CHARACTERS

| 1 | light emitting device |
|---|---|
| 70 | wavelength conversion member |

The invention claimed is:

1. A phosphor comprising a chemical structure represented by the following general formula (A):

$$A(M_{1-a-x}Eu_aMn_x)L(Si_{1-b}Ge_b)_2O_7, \quad (A)$$

wherein

A is one or more elements selected from the group consisting of Li, Na, and K, M is one or more elements selected from the group consisting of Mg, Ca, Sr, Ba, and Zn, L is one or more elements selected from the group consisting of Ga, Al, Sc, Y, La, Gd, and Lu, a is a numerical value satisfying $0.001 \leq a \leq 0.3$, b is a numerical value satisfying $0 \leq b \leq 0.5$, and x is a numerical value satisfying $0 \leq x \leq 0.2$.

2. The phosphor according to claim 1, wherein x in the general formula (A) satisfies x=0.

3. The phosphor according to claim 1, wherein x in the general formula (A) satisfies $0<x \leq 0.2$.

4. The phosphor according to claim 3, comprising a composition represented by the following general formula (6):

$$A(M_{1-a-x}Eu_aMn_x)L(Si_{1-b}Ge_b)_2O_7, \quad (6)$$

wherein

A is one or more elements selected from the group consisting of Li, Na, and K, M is one or more elements selected from the group consisting of Mg, Ca, Sr, Ba, and Zn, L is one or more elements selected from the group consisting of Ga, Al, Sc, Y, La, Gd, and Lu, a is a numerical value satisfying $0.001 \leq a \leq 0.3$, b is a numerical value satisfying $0 \leq b \leq 0.5$, and x is a numerical value satisfying $0.01 \leq x \leq 0.2$.

5. The phosphor according to claim 1, wherein A in the general formula (A) comprises Li.

6. The phosphor according to claim 1, wherein A in the general formula (A) comprises Na.

7. The phosphor according to claim 1, wherein A in the general formula (A) consists of at least two elements.

8. The phosphor according to claim 1, wherein M in the general formula (A) comprises Ba.

9. The phosphor according to claim 1, wherein M in the general formula (A) consists of at least two elements.

10. The phosphor according to claim 1, wherein L in the general formula (A) comprises Sc.

11. The phosphor according to claim 10, wherein L in the general formula (A) further comprises Y.

12. The phosphor according to claim 1, comprising a composition represented by the following general formula (2):

$$A^1_{1-y}A^2_yBa_{1-a}Eu_aScSi_2O_7, \quad (2)$$

wherein $A^1$ and $A^2$ are elements selected from the group consisting of Li, Na, and K, $A^1$ and $A^2$ are different from each other, y is a numerical value satisfying $0<y<1$, and a is a numerical value satisfying $0.001 \leq a \leq 0.3$.

13. The phosphor according to claim 1, comprising a composition represented by the following general formula (3):

$$NaBa_{1-a}Eu_aScSi_2O_7, \quad (3)$$

wherein a is a numerical value satisfying $0.001 \leq a \leq 0.3$.

14. The phosphor according to claim 1, comprising a composition represented by the following general formula (4):

$$NaBa_{1-a}Eu_aSc_{1-z}Y_zSi_2O_7, \quad (4)$$

wherein z is a numerical value satisfying $0<z<1$, and a is a numerical value satisfying $0.001 \leq a \leq 0.3$.

15. The phosphor according to claim 1, comprising a composition represented by the following general formula (5):

$$NaM^1_pM^2_qEu_aScSi_2O_7, \quad (5)$$

wherein $M^1$ and $M^2$ are elements selected from the group consisting of Mg, Ca, Sr, Ba, and Zn; $M^1$ and $M^2$ are different from each other; a is a numerical value satisfying $0.001 \leq a \leq 0.3$; p is a numerical value satisfying $0<p<1$; q is a numerical value satisfying $0<q<1$; and p, q, and a satisfy p+q+a=1.

16. A light emitting device comprising: a light emitting element that emits light having a main emission peak in a range of 350 nm to 470 nm; and a wavelength conversion member that absorbs the light emitted from the light emitting element and emits light, wherein the wavelength conversion member comprises the phosphor according to claim 1.

* * * * *